United States Patent [19]
Kato et al.

[11] Patent Number: 5,394,490
[45] Date of Patent: Feb. 28, 1995

[54] SEMICONDUCTOR DEVICE HAVING AN OPTICAL WAVEGUIDE INTERPOSED IN THE SPACE BETWEEN ELECTRODE MEMBERS

[75] Inventors: Takeshi Kato, Kokubunji; Yuuji Fujita, Koganei; Kenichi Mizuishi, Hachioji; Atumi Kawata, Urawa; Hiroyuki Itoh, Akigawa, all of Japan

[73] Assignee: Hitachi, Ltd., Tokyo, Japan

[21] Appl. No.: 104,582

[22] Filed: Aug. 11, 1993

[30] Foreign Application Priority Data

Aug. 11, 1992 [JP] Japan .................................. 4-213954
Sep. 3, 1992 [JP] Japan .................................. 4-236169

[51] Int. Cl.6 .......................... H05K 1/00; G06F 1/10
[52] U.S. Cl. ........................................ 385/14; 385/88; 385/129; 385/147; 257/432; 257/433; 257/778; 327/113; 327/237; 327/292; 326/93
[58] Field of Search ................. 385/14, 88, 89, 92, 385/129, 132, 147; 307/480, 529, 219.1; 328/30; 257/778, 432, 433

[56] References Cited

U.S. PATENT DOCUMENTS

| | | | |
|---|---|---|---|
| 4,070,516 | 1/1978 | Kaiser ................... | 385/14 |
| 4,169,001 | 9/1979 | Kaiser ................... | 385/131 |
| 4,422,088 | 12/1983 | Gfeller .................. | 385/14 |
| 4,762,382 | 8/1988 | Husain et al. ........... | 385/132 |
| 5,043,596 | 8/1991 | Masuda et al. .......... | 307/262 |
| 5,061,027 | 10/1991 | Richard ................. | 385/14 |
| 5,184,027 | 2/1993 | Masuda et al. .......... | 307/269 |
| 5,200,631 | 4/1993 | Austin et al. ........... | 257/81 |
| 5,237,434 | 8/1993 | Feldman et al. ......... | 359/19 |
| 5,319,725 | 6/1994 | Buchmann et al. ....... | 385/14 |

FOREIGN PATENT DOCUMENTS 61-177738 8/1986 Japan ........................... H01L 21/60

OTHER PUBLICATIONS

Proceedings of the IEEE, vol. 72, No. 7, "Optical Interconnections for VLSI Systems", Goodman et al, pp. 850–866, Jul. 1984.
SPIE, vol. 836, Optoelectronic Materials, Devices, Packaging, and Interconnects, 1987, "Integrated Optics approach for high-density optical interconnections in high-speed multi-chip IC packages", Sullivan et al, pp. 343–350 (month not avail.).
Proceedings of the 41st Electronic Components and Technology Conference, 1991, "Hardware Technology for Hitachi M-880 Processo Group", Kobayashi et al pp. 693–703. (no month available).
IEEE 1991 Bipolar Circuits and Technology Meeting, 5.3, 1991, "A novel design concept for small-skew clock LSIs with the self-delay-adjustment", Itoh et al, pp. 130–133. (month not available).
Yamada et al., SPIE, vol. 991 Fiber Optic Datacom and Computer Networks, 1988, "Optical interconnections using Yamada et al., Silica-based waveguide on Si substrate", pp. 4–11 (month not avail.).

*Primary Examiner*—Frank Gonzalez
*Attorney, Agent, or Firm*—Fay, Sharpe, Beall, Fagan, Minnich & McKee

[57] ABSTRACT

A clock signal supply system is disclosed for a semiconductor device with a semiconductor chip and a wiring substrate connected in flip-chip fashion and an optical waveguide interposed in the space between electrode members, in which the mutual arrangement of the electrical interconnection and the optical waveguide interconnection on the wiring substrate is not affected and can be used separately from each other for different applications, thereby improving the throughput of the interconnections as a whole. In order to distribute a very fast clock signal beyond a 1 GHz in particular without any phase deviation in the clock signal supply system, a clock distributor includes a clock oscillator, a phase adjuster for adjusting the phase at each destination of the clock signal, an optical interconnection for supplying the clock signal to the phase adjuster, a reference signal generator for generating a phase reference signal from the clock signal, and an electrical interconnection for supplying the reference signal to the phase adjuster. The clock signal is supplied by an optical interconnection having a broad frequency bandwidth, and the phase reference signal by an electrical interconnection by which the skew is controlled easily. A clock signal adjusted to high phase accuracy can thus be distributed to following destinations by the phase adjuster.

25 Claims, 14 Drawing Sheets

SEMICONDUCTOR DEVICE HAVING AN OPTICAL WAVEGUIDE INTERPOSED IN THE SPACE BETWEEN ELECTRODE MEMBERS

BACKGROUND OF THE INVENTION

The present invention relates to an optical interconnection technique for semiconductor devices having a semiconductor chip and a wiring substrate, or more in particular to a clock signal supply system for a ultra-high-speed processor of the computer.

With the increase in the scale of semiconductor devices, a higher-density assembly and a greater number of input and output terminals of the semiconductor chip are sought. In order to meet this requirement, a flip-chip connection system is conventionally used as disclosed in JP-A-61-177738 based on U.S. patent application Ser. No. 695,597 filed Jan. 28, 1985. In this connection system, the semiconductor chip is connected by bump electrodes on a wiring substrate. Electrodes can be installed over the entire surface of the semiconductor chip, thereby making multi-channel connections possible.

An increased internal operating speed of the semiconductor devices has come to pose the problem of propagation delay time and crosstalks in the electric interconnections of the substrate. For solving this problem, conventional optical interconnection techniques as described in J. W. Goodman et al. "Optical Interconnections for VLSI Systems", C. T. Sullivan et al. "Integrated optics approach for high-density optical interconnections in high-speed multichip IC packages", and Y. Yamada et al. "Optical interconnections using silica-based waveguide on Si substrate" are known. In these optical interconnection techniques, optical waveguides are used for interconnecting semiconductor chips. For lack of an increased time constant due to a capacitor and a resistor or crosstalks due to induction unlike in electrical connections, optical waveguides are said to permit high-speed, broad-band interconnections.

A multiplicity of input and output terminals for signal transmission wiring, power supply wiring and clock distribution wiring are indispensable for the semiconductor chip. The optical interconnections, in spite of its advantage of a high speed and a broad band as compared with electric interconnections, cannot reduce the size thereof to the order to wavelength. Considering the delay due to the opto-electric or electro-optic conversion time, on the other hand, the optical interconnections are advantageous over the electric connections only beyond a certain wiring length. It is therefore not advantageous to replace all the electric interconnections with optical ones on a wiring substrate, and it is necessary to secure a certain number of input-output terminals for electric interconnections beforehand. For making electrical and optical interconnections compatible with each other, applying the optical interconnection technique to the flip-chip connection system permitting multi-channel electrical connections is promising.

Two methods are available for performing optical interconnections in a flip-chip connection system: One by interconnecting on the front side and the other on the back side of the semiconductor chip. In a highly-integrated semiconductor chip, however, heat generation is so large that a fin radiator or a cooling channel is formed on the back of the chip. In the flip-chip connection system, therefore, optical interconnections are required on the front, i.e., on the wiring substrate side of the semiconductor chip.

In the aforementioned optical interconnection techniques, the method for forming electrical and optical interconnections on the wiring substrate is not specifically determined. In the case where electrical and optical interconnections are mixed in the same plane of the wiring substrate, for example, the metal forming the electrical wirings does not transmit light, and the dielectric material forming the optical waveguides does not pass electric current. In addition, if electrical wirings are formed on optical waveguides, an optical loss or a change in optical power is a probable result. This has posed the problem of limiting the mutual arrangement of the electrical and optical interconnections.

A clock signal supply system is disclosed in U.S. Pat. No. 5,184,027 and U.S. Pat. No. 5,043,596. In conventional clock signal supply systems, each destination of a clock signal has a phase adjustor in order to reduce the time skew of the clock signal and to automate the phase adjusting process. Such a phase adjuster is supplied with a clock signal and a phase reference signal having a longer period than the clock signal through electric interconnections such as cables or wiring substrate.

Generally, a shorter machine-cycle time, i.e., an improved speed of clock signal is essential for a high-performance operation of the processor.

At the present rate of increase in machine speed, the machine-cycle time, which stands at 7 to 9 nsec in the first half of the 1990s, is expected to decrease to less than 1 nsec in the 2000s, which in turn will require a clock signal of at least 1 GHz in frequency.

Such a ultra-high speed clock signal has not been taken into consideration, however, in designing conventional clock signal supply systems.

Electrical interconnections such as cable and wiring substrate are limited in frequency band by the effect of signal amplitude attenuation due to reactances, reflection caused by impedance mismatch or crosstalks.

In conventional systems, considering the electrical wiring length of several meters and the wiring diameter of less than several millimeters in the processor, it has been very difficult to distribute the clock signal of 1 GHz or more.

Conventional systems for distributing the clock signal by optical interconnections include a configuration comprising a photodetector arranged at each destination of clock signal for distributing the optical clock signal emitted from a light source through such optical paths as optical fiber, optical waveguide, lens and hologram.

The frequency band of optical interconnections is far wider than that of electrical interconnections. It is therefore possible to distribute the optical clock signal of 1 GHz or more in frequency to destinations. The optical clock distribution systems that have been suggested in the prior art, however, have failed to take into consideration the skew due to the difference in optical path length caused by the refractive index distribution, optical aberration, or optical misalignment, or due to variations in the sensitivity or response characteristics of optical detectors.

In a word, according to the prior art systems, the clock signal frequency is undesirably limited by the skew.

Of all the skews, the one due to the difference in optical path length can be reduced by using a programmable optical delay line described in the U.S. Pat. No. 3,516,86 dated May 15, 1989.

The problem of this system, however, is that the operation is very complicated as the distance between two lenses is mechanically changed by manual operation.

When this system is applied to a computer packaged with high density described in F. Kobayashi et al., "Hardware Technology for HITACHI M-880 Processor Group", Proceeding of the 41st Electronic Components and Technology Conference, pp. 693–703, for example, it is extremely difficult to adjust individual optical path lengths manually within a limited package space.

Also, this system still cannot reduce the skew caused by optical detectors.

SUMMARY OF THE INVENTION

An object of the present invention is to provide an optical interconnection technique compatible with electrical interconnections in a flip-chip connection system. In attaining the object, proper mutual arrangement of electrical and optical interconnections and proper assignment of functions between them, as well as appropriate consideration of the method of coupling and forming interconnections of optical devices are required.

Another object of the invention is to provide a clock signal supply system having a high freedom of interconnection designing, in which electrical interconnections and optical waveguide interconnections can be used separately from each other in accordance with different applications without affecting the mutual arrangement thereof.

Still another object of the invention is to provide a clock signal supply system capable of distributing the clock signal very fast without causing any phase deviation.

A further object of the invention is to provide a signal supply system with optical interconnections having a very broad frequency band of more than 1 GHz as compared with electrical interconnections and capable of supplying the clock signal without any phase deviation by the use of a phase reference signal.

According to the present invention, there is provided a clock signal supply system comprising optical waveguide interconnections in the space between electrode members for connecting the semiconductor chip and a wiring substrate in order to apply the optical interconnection technique to the semiconductor device with a semiconductor chip in flip-chip connection with the wiring substrate. Alternatively, a semiconductor chip and a wiring substrate are connected by electrode members through throughholes perpendicular to the main surface of an optical waveguide interconnection.

According to the above-mentioned configuration, optical waveguide interconnections are performed by the use of spaces between electrode members. The electrical wiring layer and the optical waveguide layer are separated from each other, and therefore the arrangement of the electrical wirings on the wiring substrate is not limited by the optical waveguide interconnections. No interference is caused unlike in the case where electrical wirings coexist in the same plane as an optical waveguide layer. A multiplicity of input/output terminals can be taken out from a semiconductor chip by means of electrode members through an optical waveguide interconnection layer, thus making it possible to use the electrical wirings and the optical waveguide interconnections separately from each other in accordance with different applications.

In order to obviate the above-mentioned problem, an optical clock supply system comprises a clock oscillator for generating a clock signal having a predetermined frequency, an optical waveguide interconnection for converting the clock signal into an optical signal, transmitting the optical signal to a plurality of predetermined points and converting the optical signal into an electrical signal at each destination, a reference signal generator for dividing the frequency of the clock signal generated from the clock oscillator and generating an electrical signal, an electrical interconnection for transmitting the electrical signal divided in frequency to the predetermined number of points, and a phase adjuster for setting the signals in phase by adjusting the phase advance or retardation of the electrical signal produced from the optical waveguide interconnection on the basis of the reference signal transmitted by the electrical interconnection and producing a clock signal having a predetermined frequency and phase to an external circuit.

In the aforementioned clock signal supply system, the optical waveguide interconnection may include an optical transmitter for converting the electrical clock signal produced by the clock oscillator into an optical clock signal and an optical transmission path for supplying the optical clock signal to the optical receiver.

The clock signal supply system according to the invention may alternatively comprise a reference signal generator which frequency-divides the clock signal having a first frequency and generates a reference signal lower than the frequency bandwidth of the electrical interconnection.

The clock signal supply system according to the invention may comprise an optical transmitter including a laser diode for oscillating the optical clock signal and a laser diode driver circuit for converting the electrical clock signal into a drive current for the laser diode.

Further, the clock signal supply system according to the invention may comprise an optical transmitter including an optical amplifier for amplifying the optical clock signal.

The optical amplifier may be a rare atom-doped fiber amplifier or a semiconductor optical amplifier based on current pumping.

The optical transmitter of the clock signal supply system according to the invention may include an optical output controller having the function of holding the signal amplitude of the optical clock signal to a predetermined value.

The optical output controller may be an auto power control circuit.

The optical receiver of the clock signal supply system described above may include a photodetector for detecting the optical clock signal and a photodetector driver circuit having the function of converting the photocurrent signal flowing in the photodetector into an electrical clock signal.

The photodetector may be configured of a photodiode.

The optical receiver of the signal supply system according to the invention may include a bandpass device for the frequency of the electrical clock signal.

The bandpass device may include a bandpass filter circuit.

Further, the clock signal supply system according to the invention may comprise an optical transmission path including an optical fiber and/or an optical waveguide.

Also, the optical transmission path may include at least a lens, a mirror, a hologram and/or a prism.

The optical transmission path of the clock signal supply system according to the invention may include an optical splitter for splitting the optical clock signal transmitted thereto.

The optical splitter may include at least one of an optical-fiber star coupler, an optical-waveguide star coupler and a beam splitter.

The optical transmission path may include at least one of an optical path changer, a focusing/collimating lens and an optical shield.

The optical path changer includes at least one a mirror, a prism and a grating. The focusing/collimating lens includes a convex/concave lens and/or a grating lens. Further, the optical shield may have at least one of a partition, a cover and a mask.

In the clock signal supply system according to the invention, the optical clock signal incident upon the optical receiver by the optical transmitter and the optical transmission path is larger than the minimum receivable optical power at the frequency of the optical clock signal.

Also, a processor including a clock signal supply system according to the invention may comprise at least two semiconductor modules each including a wiring substrate with at least two semiconductor devices electrically connected to each other.

The processor includes the optical receiver and the phase adjuster arranged in each semiconductor module. The optical receiver receives the optical clock signal splitted by the optical splitter and supplies a clock signal having a predetermined phase to each semiconductor module.

Further, in a processor comprising the clock signal supply system according to the invention, the optical receiver and the phase adjuster of the clock signal supply system may be installed on the same semiconductor substrate as the processor.

Also, the processor may comprise the optical receiver formed in a semiconductor device of silicon, with the optical clock signal less than 1 $\mu m$ in wavelength.

Furthermore, the optical receiver of the processor may include a chemical compound semiconductor on a semiconductor device of silicon, with the optical clock signal having a wavelength of 1 $\mu m$ or more.

The operation of the system according to the invention will be described below.

First, the electrical clock signal generated from the clock oscillator is converted into an optical clock signal by the optical transmitter.

The optical clock signal is transmitted to the optical receiver through the optical transmission path of sufficiently large frequency bandwidth (which may alternatively be described as an optical interconnection according to embodiments) and is converted again into an electrical clock signal by the optical receiver.

In other words, a clock signal having a high frequency is transmitted as an optical signal and finally converted into an electrical signal.

The electrical clock signal outputted from the clock oscillator, on the other hand, is divided in frequency by a reference signal generator and is transmitted to a predetermined position through an electrical interconnection.

Further, a first electrical clock signal outputted from the clock oscillator and a second electrical clock signal frequency-divided by the reference signal generator are both supplied to a phase adjuster.

The phase adjuster detects the time lag (phase deviation) between the two signals on the basis of the rise or fall of the first and second electrical signals and puts the two signals into phase by the use of a delay circuit, for example.

The phase adjuster also supplies a phase-adjusted clock signal to each destination.

As a result, the frequency of the clock signal is not limited by the bandwidth of an electrical interconnection unlike in the prior art.

More specifically, there is provided a clock signal supply system for supplying a clock signal having a high frequency without any phase deviation between clocks.

As described above, a clock signal supply system according to the invention has the advantage that any destination is not affected by the skew (which hereinafter refers to any phase deviation of the clock signal in an LSI at a clock destination) of the optical clock signal which has been unrealizable in the conventional systems.

The system according to the invention is effectively applicable to various processors in a main frame computer, for example, including the one having a long interconnect wiring for supplying clock signals.

DESCRIPTION OF THE PREFERRED EMBODIMENTS

Embodiments of the invention will be described below with reference to the accompanying drawings.

Figure 1:
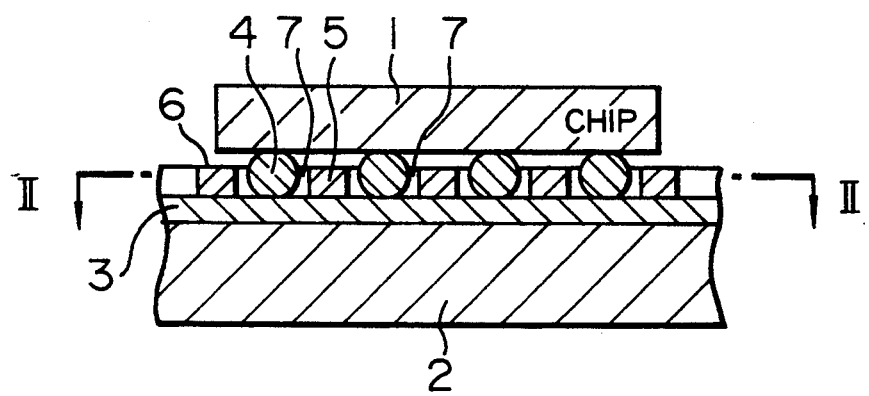
FIG. 1 is a sectional view showing a first embodiment of the invention.
Figure 2:
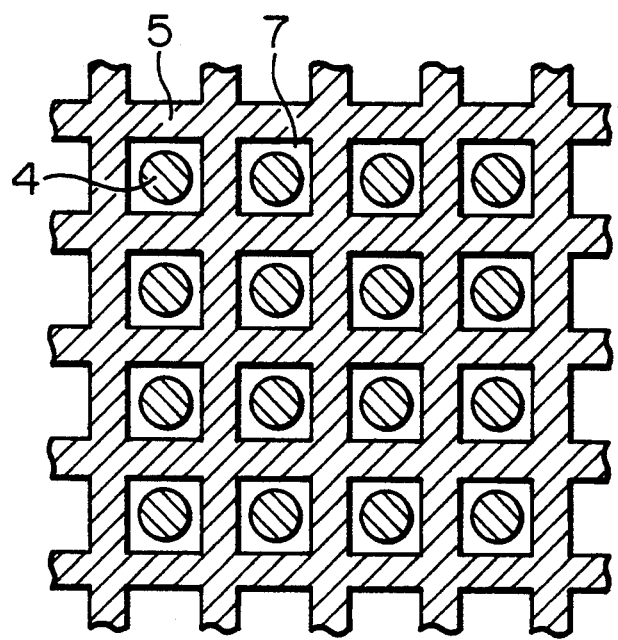
FIG. 2 is a sectional view taken in line A—A' in FIG. 1.

FIG. 1 is a diagram showing a semiconductor device according to a first embodiment of the invention, and FIG. 2 is a sectional view taken in line A—A' in FIG. 1. In FIGS. 1 and 2, a semiconductor chip 1 is connected by flip chip bonding to a wiring substrate 2. An optical waveguide interconnection 5 is interposed in the space between electrode members 4. The semiconductor chip 1 is connected with a wiring layer 3 of the wiring substrate 2 by an electrode member 4 laid through a through hole 7 perpendicular to the principal surface of the optical waveguide interconnection 5.

The semiconductor chip 1 and the wiring substrate 2 are made of a silicon or a chemical compound semiconductor. The semiconductor chip 1 has the surface of the wiring substrate 2 thereof formed with a circuit and optical device section (including a surface-emitting diode and a photodiode). The wiring layer 3 is made of a metal (such as Cu or Al) and an insulating member (such as polyimide or glass). The electrode members 4 are made of a metal bump (Pb-Sn solder, Au, etc.). The optical waveguide interconnection 5 is formed of a dielectric material (polyimide, glass, etc.) and includes a mirror or a grating for coupling to the optical device section.

The optical waveguide interconnection 5 is formed on the surface of the wiring layer 3 by such a method as coating or vapor deposition after the wiring layer 3 is formed on the wiring substrate 2. The patterning of the optical waveguide interconnection 5 and the through hole 7 are accomplished by such a method as photolithography. The semiconductor chip 1 with the electrode members 4 formed in advance thereon is installed, with the circuit-mounted side down, at a predetermined position of the wiring substrate 2, and the electrode members 4 are molten to connect the semiconductor chip 1 and the wiring substrate 2 electromechanically. The self-aligning function of the molten electrode members 4 based on the surface tension thereof eliminates the displacement between the optical device section of the semiconductor chip 1 and the optical waveguide wiring 5, thereby securing optical coupling.

The advantage of the first embodiment is that the optical waveguide can be connected to the optical device section after a multiplicity of electrical input and output terminals between the chip 1 and the electrical wiring in the wiring layer 3 are connected to each other. The arrangement of the wiring layer 3 or the electrode members 4 are not limited by the arrangement of the optical waveguide interconnection 5. In the case where optical waveguide interconnections are laid at 20 -$\mu$m pitches between the electrode members 4 with 200 -$\mu$m pitches, for example, 2500 pins of electrical connections and about 400 lines of optical waveguide interconnections 5 can be taken out from a 1-cm square semiconductor chip 1. The property of the electrical wiring and the optical waveguide interconnection can be best utilized if the optical waveguide interconnection 5 is used for the broadcast wirings (including bus network wiring and clock wiring) and the long-distance wiring (such as inputs and outputs with external units of the system) and the wiring layer 3 is used for other signal or power supply wirings. Since the optical waveguide interconnection 5 is arranged on the surface of the chip 1 facing the substrate 2, the cooling of the semiconductor chip 1 is not impeded from the opposite side. The self-alignment function of the electrode members 4 may be used for optical coupling between the optical waveguide interconnection 5 and the optical device section of the semiconductor chip 1, thereby eliminating the troublesome job of optical alignment. According to the embodiment under consideration, lattice-arranged optical waveguide interconnections 5 is formed, in which each waveguide can be considered independent as optical signals do not interfere with each other at intersections.

An example of the fabrication process of a semiconductor device will be explained with reference to FIGS. 3a to 3e.

Figure 3A:
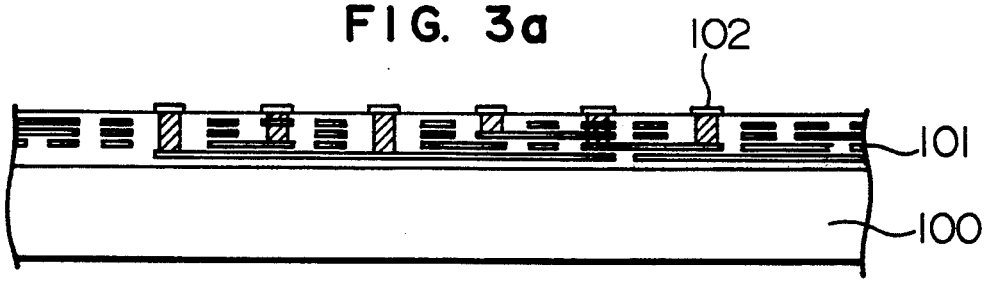
FIGS. 3a to 3e are diagrams showing the process for fabricating a semiconductor device.

The first step forms, first of all, a multilayer wiring layer 101 and electrodes 102 on the surface of a wiring substrate 100 as shown in FIG. 3a. The wiring layer 101 is formed by repeating the coating of an interlayer insulating film of polyimide or the like, vapor deposition or plating of a metal wire such as aluminum or copper and the patterning by photolithography.

Figure 3B:
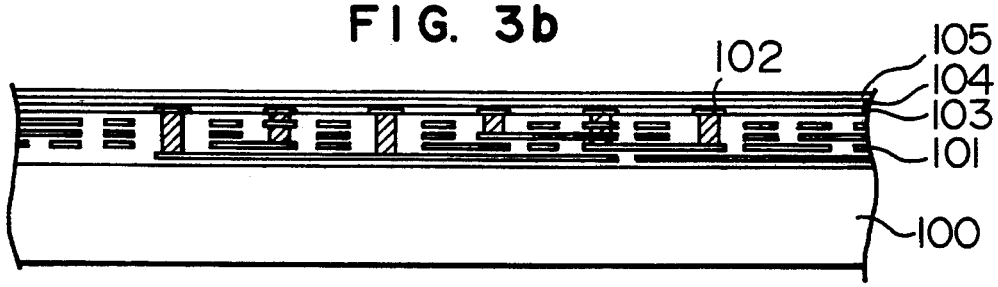

The second step, as shown in FIG. 3b, forms a core layer 104 and clad layers 103, 105 of light-sensitive polymer by coating or applying a film.

Figure 3C:
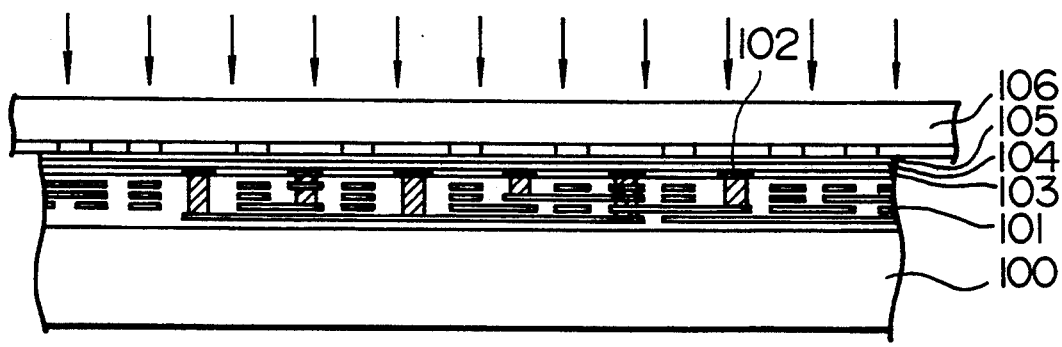

The third step, as shown in FIG. 3c, exposes the clad layers 103, 105 and the core layer 104 to light by the use of a photomask 106. The transparent portion of the photomask 106 causes the light-sensitive polymer to be exposed to the ultraviolet light to perform selective photopolymerization. After exposure, the refractive index of the core layer 104 is higher than that of the clad layers 103, 104.

Figure 3D:
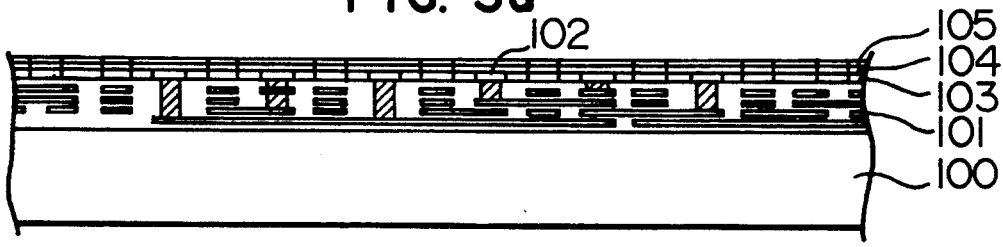

The fourth step, as shown in FIG. 3d, removes the undeveloped portion by development and thus accomplishes the patterning of the clad layers 103, 105 and the core layer 104 thereby to form an optical waveguide interconnection. In the process, the electrodes 102 are bared.

Figure 3E:
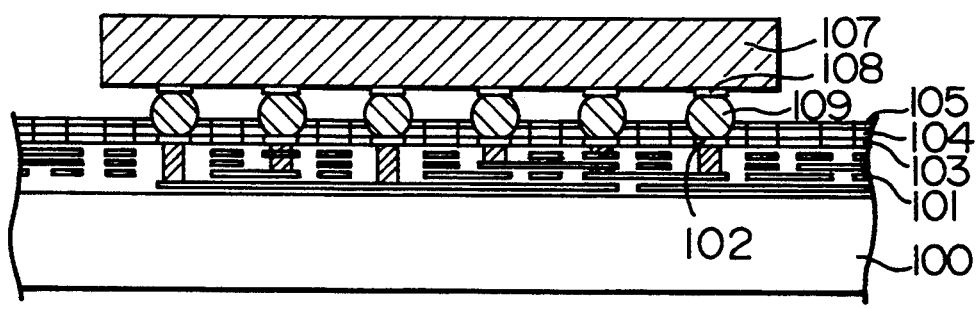

The fifth step, as shown in FIG. 3e, connects the electrodes 108 of the semiconductor chip 107 and the electrodes 102 of the multilayer wiring layer 101 by solder bumps 109.

According to a semiconductor device fabricated in the manner above, the optical signal propagates through the core layer 104 and the electrical signal through the wiring layer 101.

Apart from the above-mentioned fabrication process representing an example of two clad layers and one core layer of an optical waveguide, examples of several other structures of the optical waveguide will be explained with reference to FIGS. 4a to 4d.

Figure 4A:
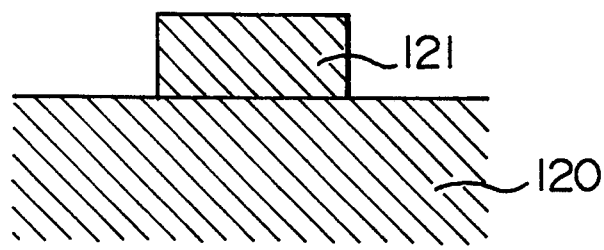
FIGS. 4a to 4d are diagrams showing the structure of optical waveguide interconnections.
Figure 4B:
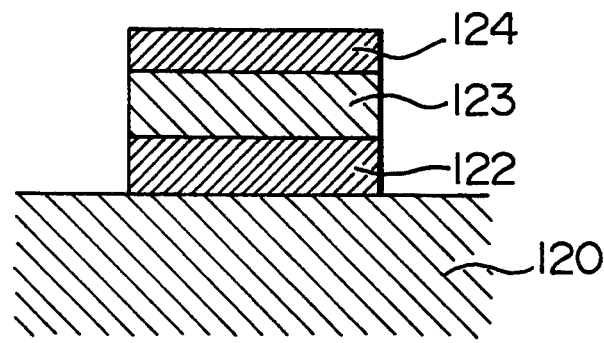
Figure 4C:
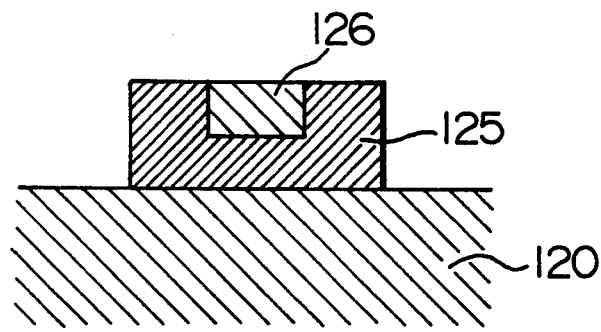
Figure 4D:
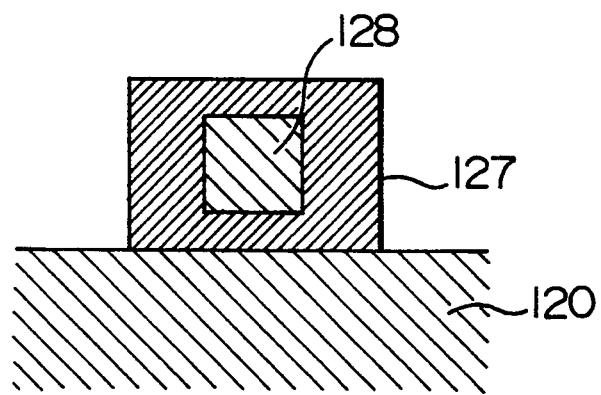

FIG. 4a shows a ridge-type waveguide 121 including a core 121 formed on an electrical wiring layer 120, FIG. 4b a waveguide with a core 123 sandwiched from two directions by clads 122, 124 as in the case of the waveguide shown in FIG. 3, FIG. 4c a buried-type waveguide with a core 126 surrounded from three directions by a clad 125, and FIG. 4d a buried-type waveguide with a core 128 surrounded from the four directions by a clad 127.

The fabrication process becomes increasingly complicated although the propagation loss of the waveguide decreases progressively in FIGS. 4a to 4d in that order. Which of the examples is to be selected depends on the intervals and distance between the waveguide interconnections and the wiring length of the waveguide.

Figure 5:
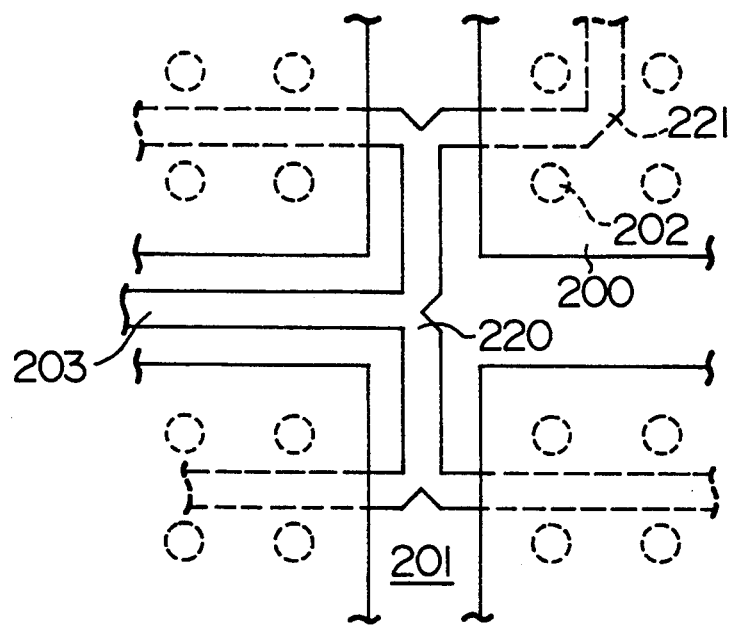
FIG. 5 is a diagram showing a method of splitting or deflection of optical waveguide interconnections.

The first embodiment shows a case in which optical waveguide interconnections cross each other in lattice form. By changing the photomask pattern shown in FIG. 3c, for example, the optical signal may be caused to branch or deflected as shown in FIG. 5. The semiconductor chip 200 and the electrical wiring layer 201 are connected by bumps 202, and the optical waveguide interconnection 203 on the wiring layer 201 is formed between the bumps 202. The optical signal is caused to branch or deflected by a reflection surface inclined 45 degrees to the optical axis at points 220 and 221 respectively.

Figure 6:
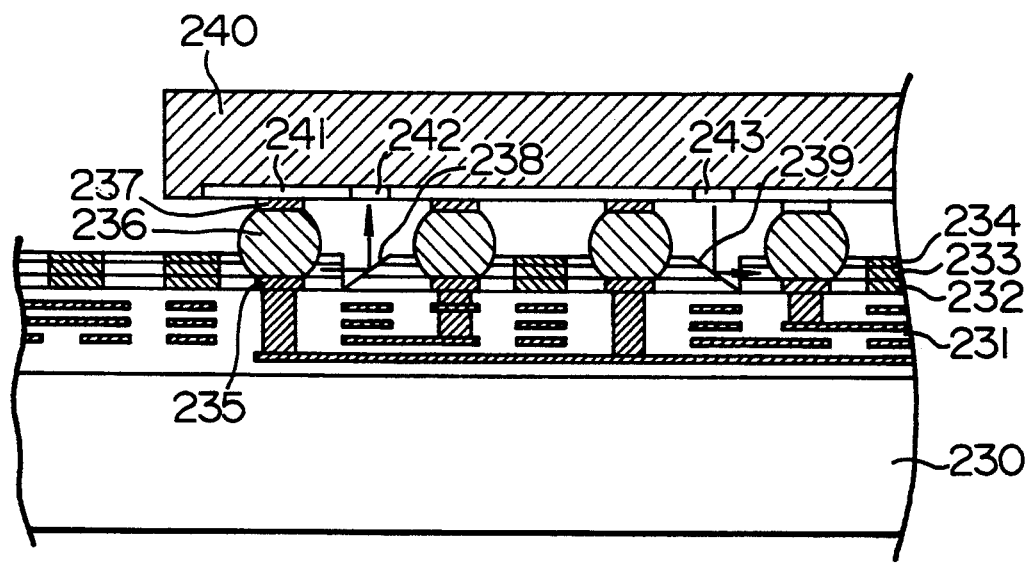
FIG. 6 is a diagram showing a mirror configuration required for optical interconnections between a wiring substrate and a semiconductor chip.

For transmission and receiving between an optical waveguide interconnection and a semiconductor chip, mirrors as shown in FIG. 6, for example, are inserted. A multilayer wiring layer 231 and an optical waveguide interconnection including clad layers 232, 234 and a core layer 233 are formed on the surface of a wiring substrate 230. The electrode 235 of the wiring layer 231 is connected to the electrode 237 of the semiconductor chip 240 formed with an integrated circuit 241 by a solder bump 235. The optical signal is incident on the photodetector 242 formed on the semiconductor chip 240 from an optical waveguide interconnection by a mirror 238. The optical signal that has emitted from the light source 243 enters the optical waveguide interconnection through a mirror 239.

Figure 7A:
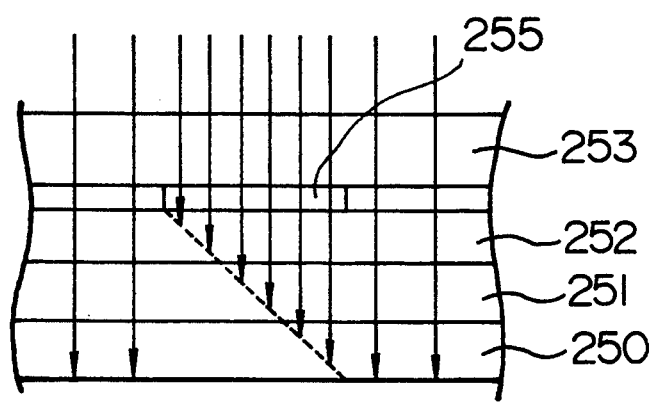
FIGS. 7a to 7c are diagrams showing the photolithography process for fabricating a mirror.
Figure 7B:
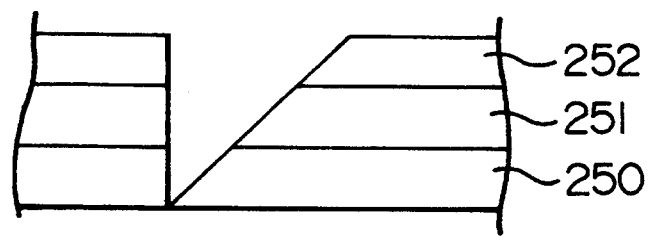
Figure 7C:
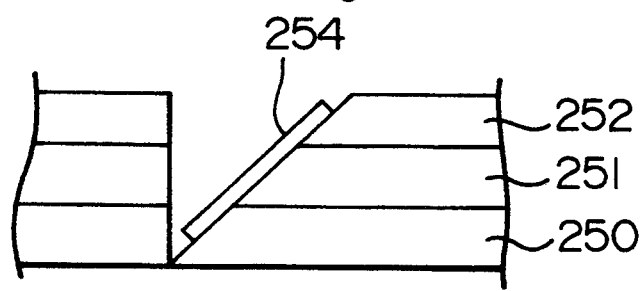

The above-mentioned mirrors can be formed by the use of a photomask as shown in FIGS. 7a to 7c in the photolithography process described with reference to FIG. 3c. More specifically, clads 250, 252 and a core 251 made of light-sensitive polymer are exposed through a photomask 253, which has a mask portion 255 with the masking amount varied in grade. In the process, the depth of the exposed portion varies as the masking amount, and therefore an inclined surface, i.e., a mirror is formed as shown in FIG. 7b after development. In the case where a higher refractive index is desired, a metal reflection film 254 is formed through the photolithography process as shown in FIG. 7c.

Figure 8:
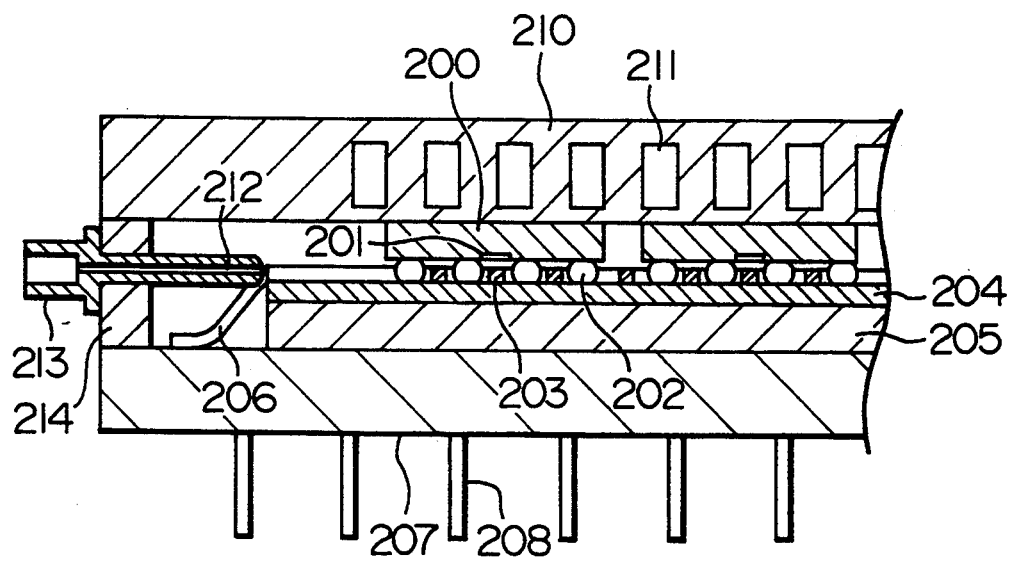
FIG. 8 is a sectional view showing a configuration for clock signal distribution using the optical waveguide interconnections according to a second embodiment of the invention.
Figure 9:
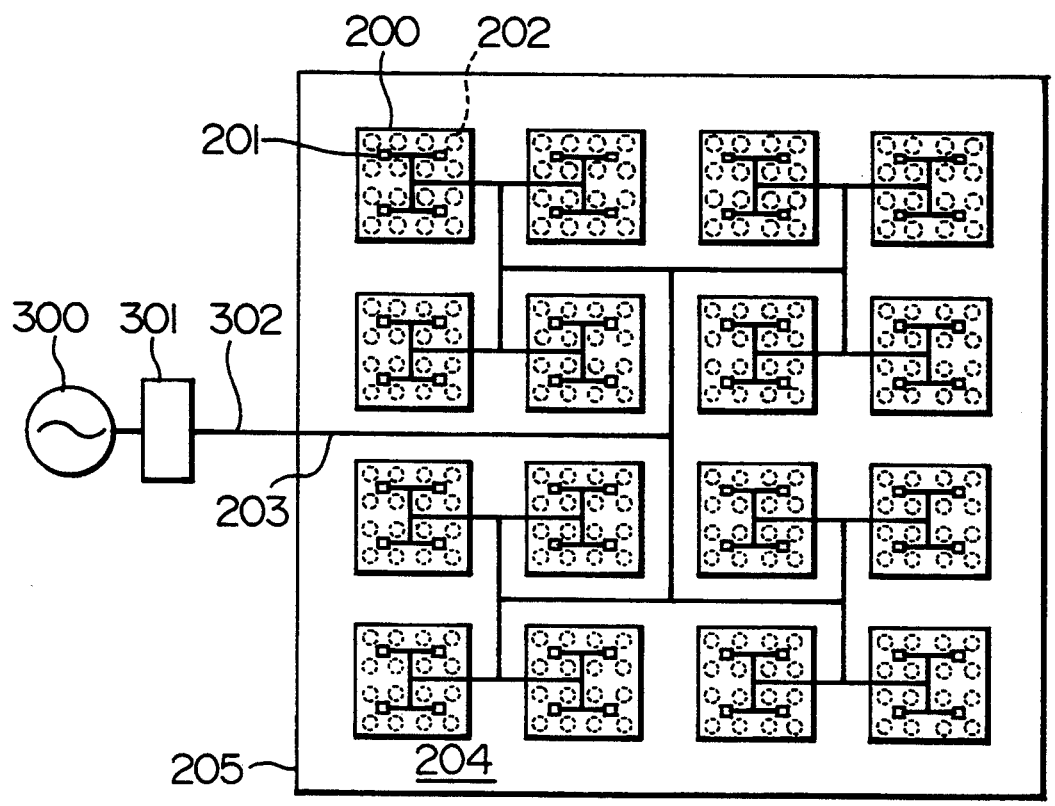
FIG. 9 is a top plan view showing a second embodiment of the invention.

Now, an example of application of an optical waveguide interconnection according to the invention to a clock signal supply system will be described with reference to FIGS. 8 and 9. In FIGS. 8 and 9, a plurality of silicon semiconductor devices 200 and a wiring substrate 205 are assembled in a package including a ceramics wiring substrate 207 and a water-cooling jacket 210, thereby constituting an silicon-on-silicon module. A high-density assembly is possible as the semiconductor device 200 is mounted in the form of a bare chip on the wiring substrate 205. Each semiconductor device 200 constitutes a destination of the clock signal.

The semiconductor device 200 has an optical receiver 201 formed in monolithic form together with an LSI circuit. The semiconductor device 200 is connected to a wiring substrate 205 by solder bumps 202. The wiring substrate 205 has a polymer optical waveguide 203 and a Cu/polyimide multiple wiring layer 204 formed thereon. The optical waveguide 203 is provided in a space between the solder bumps 202 so that the electrical connection between the semiconductor device 200 and the wiring layer 204 is not prevented. The wiring layer 204 is connected to a mullite ceramic wiring substrate 207 through a TAB (Tape Automated Bonding) 206. The wiring substrate 207 is connected with a plurality of input-output pins 208. The semiconductor device 200 is cooled by supplying water to the water channel 211 of the water-cooling jacket 210. The semiconductor device 200 is sealed by the water-cooling jacket 210, the frame 214 and the wiring substrate 207.

The optical clock signal emitted from a clock signal source 300 through an optical transmitter circuit 301 introduced to the module by an optical fiber 302, and is supplied to an optical receiver circuit 201 of each semiconductor device 200 through the optical waveguide interconnection 203 and the optical fiber 212 accommodated in a fiber connector ferrule 213 made of metal or ceramics. The optical receiver circuit 201 is formed on the silicon semiconductor device 200, and therefore the wavelength of the optical clock signal is set to less than 1 μm considering the band gap of the silicon. The ferrule 213 is fixedly sealed on the frame 214 after the mounting position thereof is aligned to the optical waveguide 203. The optical waveguide 203 has a branch wire as described with reference to FIG. 5 and also has a mirror as described with reference to FIG. 6 at a position corresponding to the optical receiver circuit 201. The wiring pattern is an H-tree fractal form equidistant from the entrance of the waveguide 203 to a plurality of destinations. The clock signal is nearly in phase with each receiver 201 of semiconductor chips 200.

Figure 10:
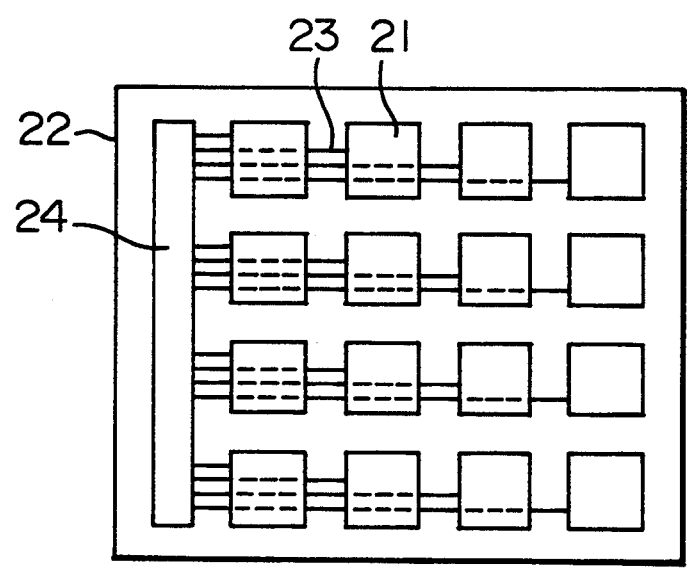
FIG. 10 is a top plan view showing a third embodiment of the invention.

FIG. 10 is a diagram showing a semiconductor device according to a third embodiment of the invention. A plurality of semiconductor chips 21 are connected in flip-chip fashion to the wiring substrate 22 (by electrode members not shown). The optical waveguide interconnection 23 is formed in the space between the electrode members. The semiconductor chips 21 are interconnected each other by bus network using the optical waveguide interconnection 23 and a control circuit 24. The control circuit 24 is formed on the silicon wiring substrate 22.

This third embodiment has an advantage in interconnecting a great number of semiconductor chips. Although the electrical wiring is limited in the number of wirings and band width, a large capacity of optical signal transmission is made possible by installing a multiplexing circuit in each semiconductor chip 21. Also, a crossbar connection network is realized by the use of an optical switch in place of the control circuit 24.

In the above-mentioned embodiments, the arrangement of an optical waveguide interconnection relative to a semiconductor chip and a wiring substrate is important. In addition to the silicon substrate, this applies of course equally to the printed wiring board and the multilayer ceramic substrate. An appropriate optical waveguide material such as polyimide, glass or semiconductor may be selected for designing the waveguide structure and propagation mode in accordance with different applications. Also, although an optical waveguide interconnection is formed on the surface of a wiring substrate according to the embodiments described above, other possible methods include mounting a separately-fabricated optical waveguide substrate on a wiring substrate or establishing an optical waveguide interconnection by printing or forming.

Figure 11:
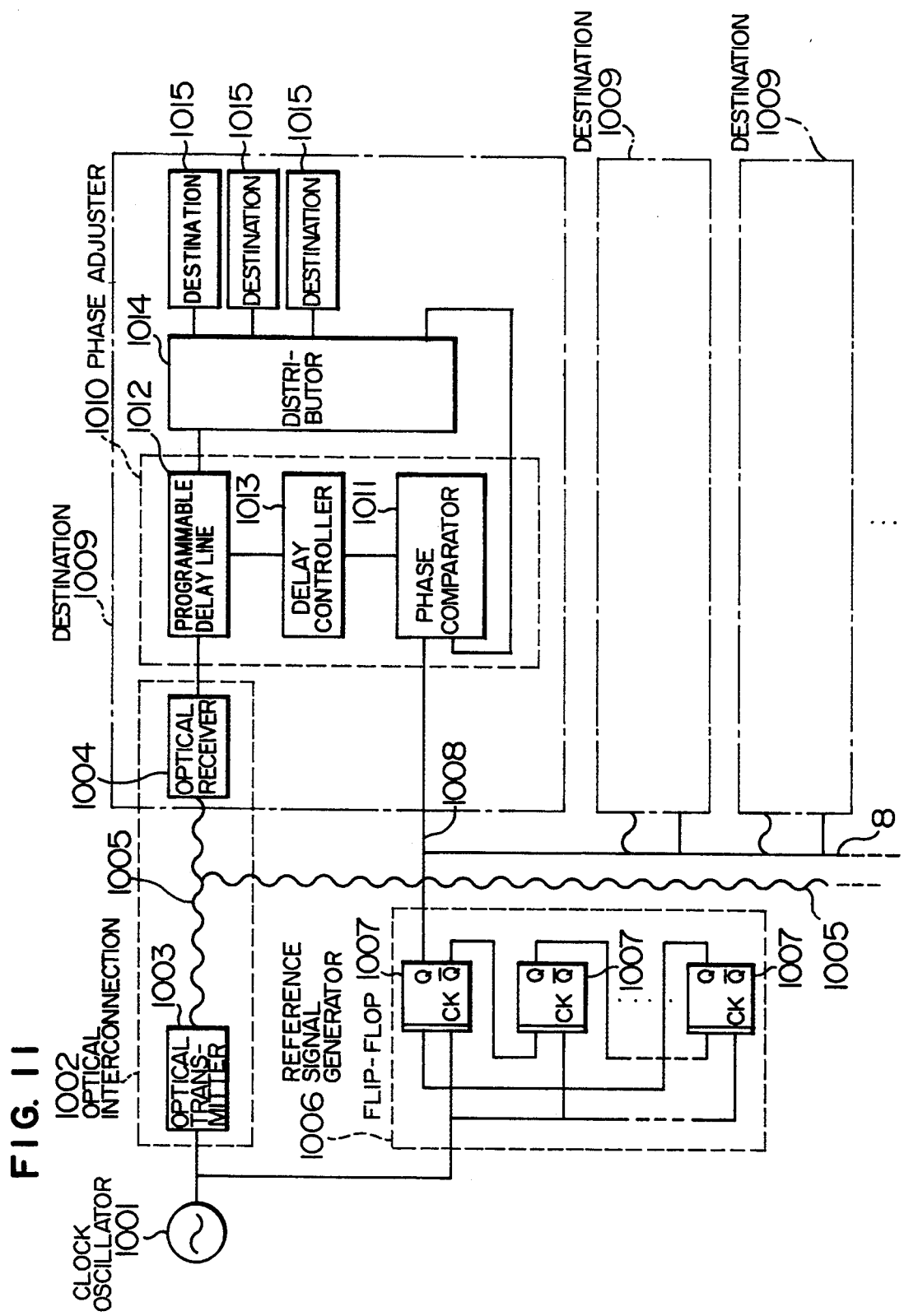
FIG. 11 is a diagram showing the configuration of a clock signal supply system according to a fourth embodiment of the invention.

FIG. 11 shows the configuration of a clock signal supply system according to a fourth embodiment.

This embodiment comprises a clock oscillator 1001 for generating a clock signal, a phase adjuster 1010 for adjusting the phase of the clock signal, an optical interconnection 1002 for supplying the clock signal from the clock oscillator 1001 to the phase adjuster 1010, a reference signal generator 1006 for generating a reference signal from the clock signal for phase adjustment, and an electrical interconnection 1008 for supplying a reference signal to the phase adjuster 1010 from the reference signal generator 1006.

The destination 1009 of the clock signal and the reference signal has a phase adjuster 1010 and a distributor 1014 for supplying a phase-adjusted clock signal to underlying destinations 1015. Further, the optical interconnection 1002 includes an optical transmitter 1003, an optical receiver 1004 and an optical transmission path 1005.

The optical transmitter 1003 is for converting an electrical clock signal outputted from the clock oscillator 1001 into an optical clock signal.

The optical receiver 1004 is for converting an optical clock signal into an electrical clock signal.

The optical transmission path 1005 is for transmitting and supplying an optical clock signal to the optical receiver 1004 around the wiring substrate from the optical transmitter 1003.

The optical transmitter 1003 is realized by a light source such as a laser diode, a solid-state laser and a driver.

The electrical clock signal produced from the clock oscillator 1001 is converted into an optical clock signal by a method using, as well known in the field of quantum electronics, an external light modulator based on the pumping control of laser oscillation, mode locking or electrooptic effect.

The optical receiver 1004 is realized by, for example, a photodetector such as a photodiode or a photoconductor with a driver.

The electrical clock signal subjected to opto/electric conversion at the optical receiver 1004 in the destination 1009 is supplied to the phase adjuster 100.

Generally, the electro/optic conversion at the optical transmitter 1003 and the opto/electric conversion at the optical receiver 1004 can be accomplished in a frequency band of 100 GHz or higher.

The optical output of the optical transmitter 1003 is set to such a value that an optical clock signal of more than a minimum receivable optical power at a clock frequency is supplied to the optical receiver 1004, considering the propagation loss, coupling loss and branching loss of the optical transmission path 1005.

The optical transmission path 1005 is realized by an optical system using an optical waveguide with an optical fiber, a slab or channel optical waveguide or an optical device with a lens, hologram, mirror or a prism in accordance with the packaging environment of the processing system to which the fourth embodiment is applicable.

In order to supply an optical clock signal to a plurality of destinations 1009, the optical transmission path 1005 includes an optical splitter.

The optical splitter is realized by a star coupler, power splitter or a broadcast optical system. Also, the optical splitter may be combined in a multiplicity of units. In this case, the configuration of the optical splitter is determined in accordance with the number of destinations in such a manner as to supply an optical clock signal of predetermined amplitude to the optical receiver 1004. The transmission bandwidth of the optical transmission path 1005 depends on the interconnection distance. For example, it is 1 Tera (Hz.m) or more for the single-mode optical fiber, which is a sufficient value for distribution of the optical clock signal.

A reference signal generator 1006 generates a reference signal within the frequency bandwidth of the electrical interconnection 1008 on the basis of the clock signal supplied from the clock oscillator 1001.

The reference signal generator 1006 is configured of a frequency divider with a plurality of flip-flops 1007 in series as in the method described in H. Itoh et al., "A Novel Concept for Small-Skew Clock LSIs with the Self-Delay-Adjustment", IEEE 1991 Bipolar and Technology Meeting 5.3, pp. 130–133. Also, though not shown, in order to supply the reference signal to a plurality of destinations 1009, the reference signal generator 1006 includes an output buffer circuit for increasing the fan-out. Such a buffer circuit might be included as required and does not constitute an essential part of the invention.

The electrical interconnection 1008, which is selected in accordance with the packaging conditions, includes a coaxial cable, a printed wiring board, solder bumps or a ceramic wiring substrate, etc. Typically, the chip 1 in FIG. 1 corresponds to the destination 1009 in FIG. 11. The optical and electrical interconnections 1002, 1008 include the optoelectric connections, interconnections in the wiring substrate, the waveguide on the wiring substrate, the bumps and the optical coupling between chip and wiring substrates all the way up to the chip 1 (FIG. 1).

In order to supply a reference signal in phase to a plurality of destinations 1009, as disclosed in U.S. Pat. Nos. 5,184,027 and 5,043,596, it is necessary to determine load conditions and wiring distance accurately in advance. The transmission delay time of the electrical interconnection 1008 is thus controlled and the reference signals are placed in phase at the destinations 1009.

Generally, the transmission bandwidth of the electrical interconnection 1008 is several GHz.m in maximum. The frequency of the reference signal is safely within the bandwidth of the electrical interconnection 1008.

The phase adjuster 1010 is for adjusting the phase of the clock signal supplied from the optical receiver 1004 on the basis of the reference signal supplied from the electrical interconnection 1008.

Various methods of phase adjustment are conceivable according to the clock frequency, the time width of clock signal adjustment, etc. The methods disclosed in U.S. Pat. Nos. 5,184,027 and 5,043,596, for example, may be used. In such a case, the phase adjuster 1010 includes a programmable delay line 1012 for receiving the clock signal from the optical interconnection 1002, a phase comparator 1011 for detecting the phase advance or retardation of the clock signal supplied through the programmable delay line 1012 as relative to the reference signal supplied from the electrical interconnection 1008, and a delay controller 1013 for controlling the delay time of the programmable delay line 1012 on the basis of the phase advance or retardation.

The phase comparator 1011 includes, for example, a set-reset flip-flop circuit with two NOR gates cross-connected.

The phase of the clock signal fed back to the phase comparator 1011 through the programmable delay line 1012 and the distributor 1014 from the optical receiver 1004 is compared with the phase of the reference signal, so that a high or low level signal is applied to the delay controller 1013 in accordance with the phase advance or retardation.

The programmable delay line 1012 includes, for example, a multi-stage selector circuit with signal routes of different transmission delay times. The signal lines may include an OR gate, a differential circuit or a delay line.

The selector circuit is switched to select a signal route, and the delay time is thus changed to adjust the phase of the clock signal. The delay time is controlled by the delay controller 1013.

The number of stages of the selector circuit and the transmission time of the signal route are determined in consideration of the variable width and time resolution at the clock frequency.

The delay controller 1013 includes, for example, an up-down counter.

In the case where the phase comparator 1011 indicates that the clock signal leads the reference signal, the output pulse is set to high level. Conversely, when the clock signal lags behind the reference signal, the output pulse is set to low level.

The up-down counter counts up one for each high-level pulse, and counts down one for each low-level pulse.

The output terminal representing each digit of a binary counter is connected to the input terminal in each stage of the selector circuit of the programmable delay line 1012.

Each selector circuit selects a signal route of large delay time in response to an input value of "1", and a signal route of small delay time in response to an input value of "0".

This control operation puts the clock signal in phase with the reference signal.

The distributor 1014 supplies the clock signal corrected by the phase adjuster 1010 to the following destination 1015, and feeds a part of the output back to the phase comparator 1011 for phase adjustment.

The distributor 1014 includes, for example, a buffer circuit and a frequency divider.

In the case where a multi-phase clock signal is required at the destination 1015, for example, the clock signal supplied from the programmable delay line 1012 is frequency-divided to generate a clock signal having a predetermined frequency and phase.

In a clock signal supply system according to a fourth embodiment, the clock signal generated from the clock oscillator 1001 is supplied to the destination 1009 by the optical interconnection 1002. The reference signal generated from the clock signal by the reference signal generator 1006, on the other hand, is supplied to the destination 1009 through the electrical interconnection 1008.

The clock signal is set in phase with the reference signal by the phase adjuster 1010 included in the destination 1009.

In this way, the phase-adjusted clock signal is supplied to the underlying destinations 1015 through the distributor 1014.

The frequency bandwidth of the optical interconnection 1002 is so large that a clock signal beyond the frequency bandwidth of the conventional electrical interconnection can be supplied to the destination 1009.

Since the electrical interconnection 1008 is easy to adjust the signal phases as compared with the optical interconnection 1002, reference signals in phase are supplied to the phase adjuster 1010.

In other words, the phase of the clock signal can be adjusted with high accuracy.

As a result, according to the embodiment under consideration, the clock signal very high in speed and small in skew is capable of being supplied to the destinations 1015.

Now, explanation will be made about the optical transmitter 1003 and the optical receiver 1004 in the clock signal supply system according to the fourth embodiment.

Figure 12:
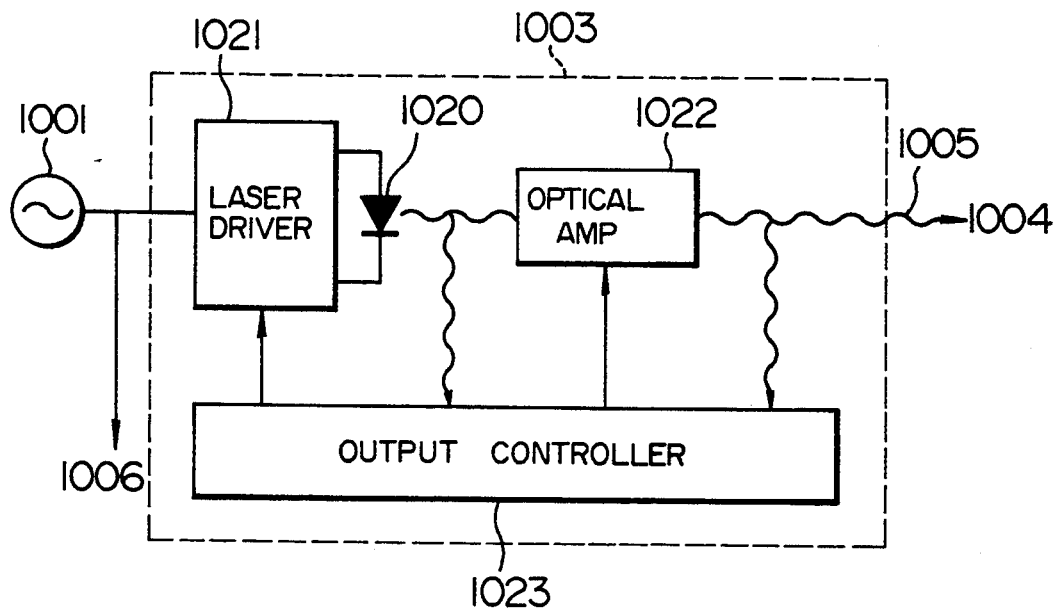
FIG. 12 shows the configuration of an optical transmitter according to a fifth embodiment of the invention.

FIG. 12 shows a configuration of the optical transmitter 1003 of a clock signal supply system according to a fifth embodiment. The optical transmitter 1003 according to this embodiment includes a laser diode 1020, a driver 1021 therefor, an optical amplifier 1022 for amplifying the optical clock signal emitted from the laser diode 1020, and an optical output controller 1023 for holding a predetermined constant amplitude of the optical clock signal.

The laser diode 1020, which includes a semiconductor device, has the advantages of small size and operating ease as compared with the solid or gas laser.

The laser diode 1020 may be comprised of a laser of a well-known index guide type or distributed feedback type of larger frequency bandwidth rather than a well-known gain-guide type.

The driver 1021 may operate by the gain switch, mode locking or external modulation. Nevertheless, the direct modulation offering a simple configuration is employed.

The driver 1021 is for converting the electrical clock signal generated from the clock oscillator 1001 into a laser modulation current, and superimposing it on a predetermined value of DC bias current, injects into the laser diode 1020. The direct modulation process produces a modulation bandwidth of about 10 GHz. In the case where a broader bandwidth is desired, however, other driving method may be used.

The optical amplifier 1012 may be a well-known traveling wave-type semiconductor optical amplifier having a amplification bandwidth of 1 THz or more, for example. Such an amplifier has the advantage of a smaller size than the rare atom-doped fiber optical amplifier (which refers to an optical fiber doped with a rare earth element like erbium).

The amplification gain depends on the pumping current. The value of the pumping current is set taking into consideration the optical output of the laser diode 1020, the loss of the optical transmission path 1005, the receiving sensitivity of the optical receiver 1004, etc. In the case where the optical output to the optical receiver 1004 is yet insufficient, the optical amplifier 1022 may be installed intermediate of the optical transmission path 1005 or immediately before the optical receiver 1004.

The optical output controller 1023 includes a differential amplifier circuit having an electronic device such as a transistor.

The optical output controller 1023 is for detecting a part of the optical output of the laser diode 1020 and the optical amplifier 1022 and controlling the drive current for the laser diode 1020 and the optical amplifier 1022 on the basis of the difference between the detected voltage and the reference voltage.

As a result, the amplitude value of the optical clock signal is maintained at constant level, and therefore the optical signal can be detected by the optical receiver 1004 in steady manner.

According to this embodiment, the optical clock signal can be transmitted by a small and simple driver 1021 and the optical amplifier 1022.

The optical amplifier 1022 permits the optical receiver 1004 to be supplied with an optical clock signal having a sufficient amplitude of more than a minimum receivable optical power.

Also, a broad frequency bandwidth is secured as compared with the case of increasing the transmitted light output by driving the laser diode 1020 with a large-amplitude current.

Further, the optical output controller 1023 stabilizes the optical output signal, and therefore no signal discrimination error is caused by optical power fluctuation at the optical receiver 1004.

Figure 13:
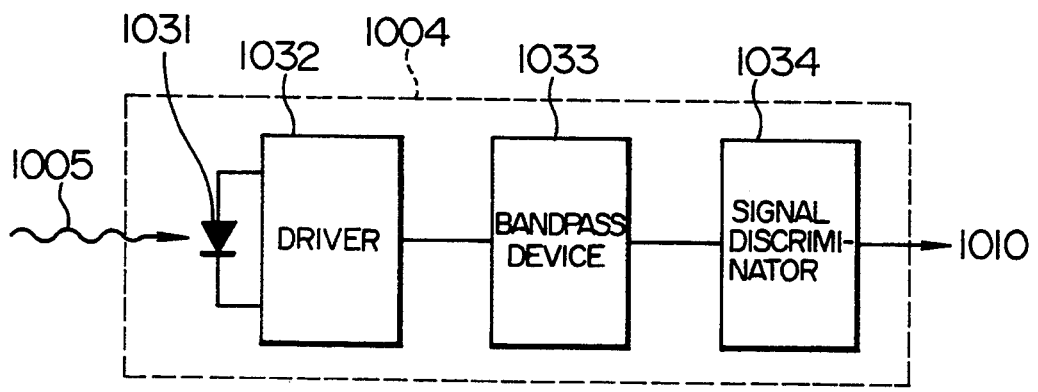
FIG. 13 is a diagram showing the configuration of an optical receiver according to a sixth embodiment of the invention.

FIG. 13 is a diagram showing a configuration of the optical receiver 1004 in a clock signal supply system.

According to this embodiment, the optical receiver 1004 includes a photodetector 1031 for detecting the optical clock signal, a driver 1032 therefor, a bandpass device 1033 for passing the clock frequency, and a signal discriminator 1034.

The photodetector 1031 used according to the embodiment is a photodiode, for example, small in size and easy to operate.

The photodiode is a PIN-type photodiode, an MSM-type photodiode, or an avalanche-type photodiode having the function of photocurrent amplification.

As described with reference to FIG. 12, in the case where a sufficiently large optical clock signal is supplied, the PIN/MSM-type photodiodes which are easily fabricated are more desirable than the avalanche-type photodiode.

The driver 1032 includes a bias circuit for applying a reverse bias voltage to the photodiode and an amplifier circuit for amplifying the photocurrent generated by the optical clock signal that has entered the light-detection area.

The junction capacitance and the applied voltage of the photodiode and the load resistance of the driver 1032 are set in a manner to have a sufficient bandwidth for the clock frequency.

In the PIN-type photodiode, which generally offers a bandwidth of several tens of GHz, the light detection area and the width of the depletion layer are set to a small value in the case where a broader bandwidth is required. It is, however, necessary to increase the optical alignment precision of the optical transmission path 1005 for the photodiode 1031 and the amplification gain of the driver 1032 at the same time.

The bandpass device 1033 may be configured of an appropriate bandpass filter. The filter includes, for example, various electronic devices such as a transistor, a capacitor and a resistor.

The filter operates to eliminate the noise having a low-range or high-range frequencies from the clock frequency. This filter may be omitted in the case where the output of the optical clock signal is sufficiently large compared with the noise.

The signal discriminator 1034 slices the output signal passed through the bandpass device 1033 at a predetermined voltage level thereby to take out an electrical clock signal of a predetermined amplitude.

According to the sixth embodiment, the small, simple photodetector 1031 is capable of detecting an optical clock signal.

It is important to assure that the optical receiver 1004, which is provided for each of the destinations 1009, be small in size for applications under a high-density packaging environment.

The driver 1032 and the signal discriminator 1034 convert the optical signal detected by the photodetector 1031 into an electrical clock signal.

The bandpass device 1033, which eliminates the noise of the detection current, is capable of supplying a clock signal to the destination 1009 reliably.

In this way, the devices according to the fifth and sixth embodiments are combined to supply a very fast clock signal of about 10 GHz with a small and simple system.

Figure 14:
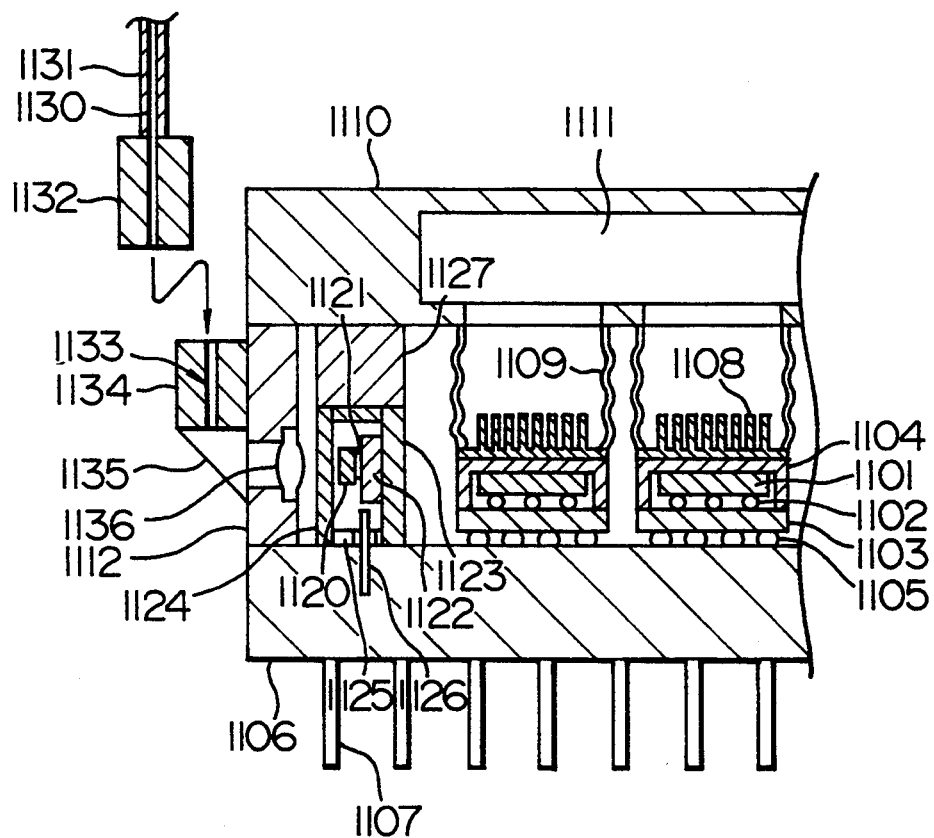
FIG. 14 is a sectional view showing the configuration of a processor to which a clock signal supply system is applied according to a seventh embodiment of the invention.

FIG. 14 shows a seventh embodiment of the invention.

The embodiment under consideration relates to a processor to which the clock signal supply system described above is applied. A sectional view of a configuration of the processor is shown in FIG. 14.

The processor is defined as a device having the function of a predetermined signal processing operation.

The processor according to this embodiment includes a plurality of semiconductor modules, one of which is shown in FIG. 14.

This processor is used as built in a mainframe computer system, for example. In FIG. 14, the semiconductor module includes a plurality of semiconductor devices 1101, wiring substrates 1103, 1106 and a water-cooling jacket 1110.

Each semiconductor device 1101 formed with an LSI circuit is connected to a mullite (the name of a ceramic material group) ceramic wiring substrate 1103 by a solder bump 1102 (indicating a very small spherical solder protrusion), and is sealed in package by an AlN cap (made of aluminum nitride) 1104 high in thermal conductivity.

The package configured of the wiring substrate 1103 and the cap 1104 is connected to a mullite multilayer ceramic wiring substrate 1106 by the solder bump 1105. Input-output pins 1107 of the module are connected to a multilayer printed wiring substrate, though not shown.

A water-cooling system is used for cooling the semiconductor device 1101, Water is supplied through a water channel 1111 of the water-cooling jacket 1110 and a bellows 1109 to cool the semiconductor device 1101 through a fin radiator 1108. The water-cooling jacket 1110 and the frame 1112 are fixedly sealed on the multilayer ceramic wiring substrate 1106.

The water-cooling jacket 1110, the bellows 1109 and the frame 1112 are made of Kovar alloy, and the fin radiator 1108 of aluminum nitride, for example.

The semiconductor module providing a destination 1009 includes an optical receiver 1004 having a photodiode 1120 and a semiconductor device 1122, a phase adjuster 1010, and a distributor 1014. The latter two are formed on the same semiconductor device 1122.

The PIN-type InGaAs photodiode 1120 is connected in flip-chip fashion to a GaAs semiconductor device 1122 by a solder bump 1121. The semiconductor device 1122 is connected to a wiring substrate 1106 through an input-output pin 1126.

The photodiode 1120 and the semiconductor device 1122 are sealed in a package including a base 1123, a frame 1125 and a glass cap 1124.

The package is cooled through a thermal conduction block 1127 and the water-cooling jacket 1110.

The optical clock signal of, say, 1.3 ($\mu$m) in wavelength outputted from the optical transmitter 1003 is supplied to the photodiode 1120 providing the optical receiver 1004 through the optical transmission path 1005. The optical transmission path 1005 includes optical fibers 1130, 1133, a prism 1135 and a lens 1136.

The single-mode optical fiber 1130 having a diameter of 125 $\mu$m is protected by a resin cover 1131 with an optical connector 1132 of plastic mold attached at the forward end thereof.

The optical connector 1132 is connected to a receptacle 1134 of plastic mold by guiding pins.

The optical clock signal that has been transmitted through the optical fiber 1133 in the receptacle 1134 is changed in the path by a glass prism 1136, focused by a glass lens 1136 fixedly sealed on the frame 1112, and is led to the light-detection area of the photodiode 1120 through the glass cap 1124.

The receptacle 1134 and the prism 1135 are fixed on the frame 1112 after optical alignment.

The photocurrent generated by the light detected by the photodiode 1120 is converted into an electrical clock signal by the optical receiver 1004 formed on the semiconductor device 1122. The electrical clock signal is supplied to the phase adjuster 1010 formed on the same semiconductor device 1122.

The phase reference signal outputted from the reference signal generator 1006 is supplied to the semiconductor device 1122 through the electrical interconnection 1008. The electrical interconnection 1008 includes an electrical cable, a printed wiring board, input-output pins 1107, a wiring substrate 1106 and an input-output pin 1126.

The transmission delay time of the electrical interconnection 1008 is set to an equal level for all the semiconductor devices 1122 providing the destinations 1009.

The phase adjuster 1010 of the semiconductor device 1122 sets the clock signal in phase with a reference signal.

The phase-adjusted clock signal is divided in frequency by a distributor 1014 into a multiphase clock signal. The multiphase clock signal is supplied to a plurality of semiconductor devices 1101 constituting the destinations 1115 through input-output pins 1126 and wiring substrates 1106, 1103.

The fourth embodiment realizes a configuration including the optical receiver 1004 and the phase adjuster 1010 without adversely affecting the high-density package structure of the semiconductor modules providing the destinations 1009. More specifically, the phase adjuster 1010 included in the semiconductor 1122 is supplied with a clock signal through the optical transmission path 1005 (optical fiber portion 1130, lens 1136, etc.) and the optical receiver 1004 (the photo diode 1120 and the semiconductor device 1122) on the one hand, and with a reference signal from the reference signal generator 1006 through the electrical interconnection 1008 (wiring substrate 1106, input-output pins 1107, 1126, etc.) on the other hand.

Also, the clock signal adjusted by the phase adjuster 1010 is supplied to a plurality of semiconductor devices 1101 constituting designations 1115 through the distributor 1014 on the semiconductor device 1122, the wiring substrate 1106, etc.

In this way, a plurality of semiconductor devices 1101 in the semiconductor module are supplied with a very fast clock signal of predetermined phase.

The use of a processor explained in the seventh embodiment for performing the synchronous operation of a multiplicity of semiconductor devices 1101 realizes a very fast large-scale computer.

Figure 15:
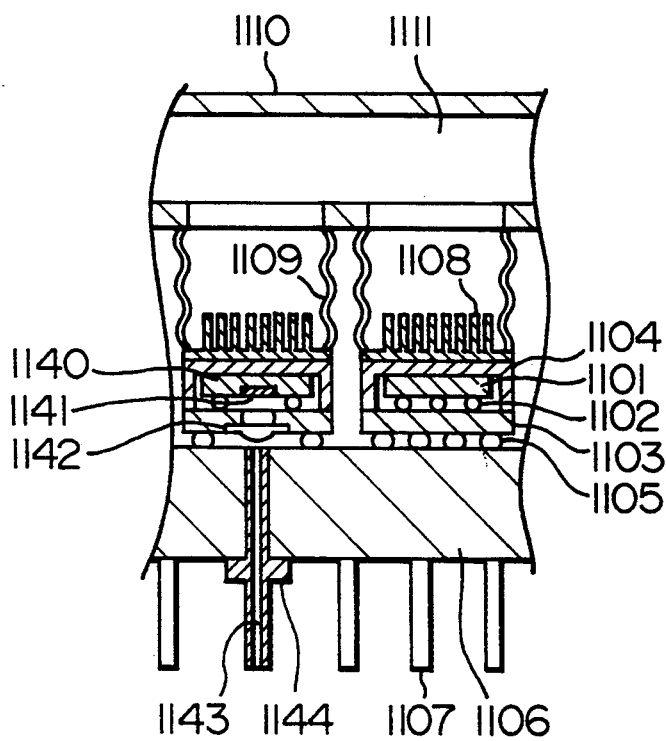
FIG. 15 is a diagram showing a sectional view showing the configuration of a processor to which a clock signal supply system is applied according to an eighth embodiment of the invention.

FIG. 15 is a sectional view showing the structure of a processor to which a clock signal supply system according to the eighth embodiment of the invention is applied. Unlike in the fourth embodiment, a single OEIC (Optoelectronic Integrated Circuit) 1140 doubles as an optical receiver 1004 and a phase adjuster 1110 in a semiconductor module providing a destination 1009.

The GaAs OEIC 1140 includes an optical receiver 1004 having an optoelectronic circuit with an MSM (Metal-Semiconductor-Metal) photodiode 1141 and an FET, and a phase adjuster 1010 having an electronic circuit with an FET, both of which are formed on the same substrate of the OEIC 1140.

The OEIC 1140, like the semiconductor device 1101, is sealed in package, and is cooled through a cap 1104 and a fin radiator.

An optical clock signal of, say, 0.8 $\mu$m in wavelength outputted from the optical transmitter 1003 is incident on a photodiode 1141 through an optical transmission path 1005.

The optical transmission path 1005 includes an optical fiber portion 1143 and a lens 1142.

The optical fiber portion 1143 is covered with a connector ferrule 1144 through the wiring substrate 1106. The optical fiber portion 1143 and the lens 1142 are optically aligned automatically and so are the lens 1142 and the photodiode 1141 with each other by the self-alignment function of the solder bumps 1102, 1105 respectively.

More specifically, the solder bump forms into a sphere by the surface tension of the molten solder. In the case where the chip 1140 or the substrate 1103 are displaced from the proper position of the substrate 1103 or 1106 respectively, the solder bump is deformed and the surface tension is exerted on the bump as it attempt to form into a sphere. As a result, the displacement is corrected, thus performing the self-alignment function.

Electrical and optical connectors for the input-output pins 1107 and the ferrule 1144, though not shown, are provided on the multilayer printed wiring board connected with a module. These connectors can be fitted in or pulled off at the same time (with the module pins 1107 and the ferrule 1144 inserted into or pulled out from the printed wiring board at the same time).

The reference signal is supplied through the electrical connection 1008 from the reference signal generator to the OEIC 1140. The electrical connection 1008 includes an electric cable, a printed wiring board, input-output pins 1107, a wiring substrate 1103, 1106, and solder bumps 1102, 1105.

The clock signal of which the phase has been adjusted on the basis of the reference signal is supplied through the distributor 1014 on the OEIC 1140 and the wiring substrates 1106, 1103 to a plurality of semiconductor devices 1101 making up destinations 1015.

According to this fifth embodiment, the optical receiver 1004 and the phase adjuster 1010 are formed on the same semiconductor substrate in the OEIC 1140, and connected to the wiring substrates 1103, 1106 by the low-capacitance solder bumps 1102, 1105. Therefore, as compared with the fourth embodiment, a broader frequency bandwidth is obtained.

The optical clock signal is supplied to the phase adjuster 1010 of the OEIC 1140 through the optical transmission path 1005 (including the optical fiber portion 1143, etc.) and the optical receiver 1004 (on the OEIC 1140 according to the embodiment).

The reference signal is supplied to the phase adjuster 1010 through the electrical connection 1008 (including the wiring substrates 1106, 1103, the solder bumps 1105, 1102).

The clock signal adjusted at the phase adjuster 1010 is supplied by the distributor 1014 to a plurality of semiconductor devices 1101 providing destinations 1015.

Although the fourth embodiment has the position of installation of the phase adjuster 1010 limited to the neighborhood of the frame 1112 of the semiconductor module, the installation at any desired position is possible according to the fifth embodiment.

The OEIC 1140 is accommodated in a nearly-common package as for the semiconductor devices 1101, and therefore is suitable as an assembly structure. Also, the self-alignment function of the solder bumps 1102, 1105 makes it possible to omit the complicated optical alignment between the optical fiber portion 1143 and the photodiode 1141.

As compared with the cooling by thermal conduction for the seventh embodiment, the fifth embodiment employs a water-cooling system, and therefore the OEIC 1140 can be cooled efficiently.

Figure 16:
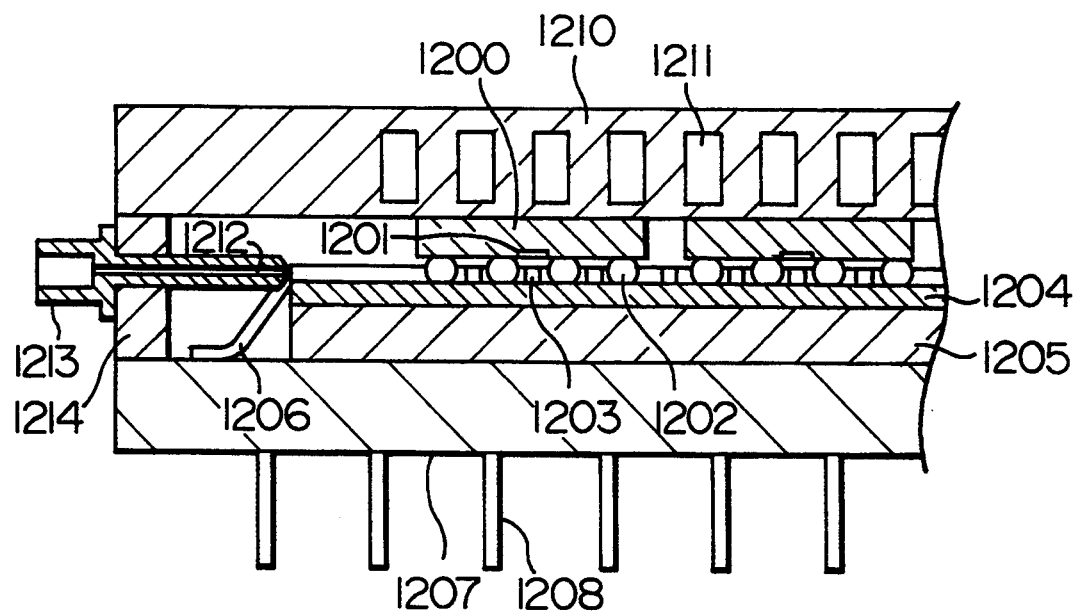
FIG. 16 is a diagram showing a sectional view of the configuration of a processor to which a clock signal supply system is applied according to a ninth embodiment of the invention.

FIG. 16 is a sectional view showing the structure of a processor to which the clock signal supply system according to the ninth embodiment of the invention is applied.

The processor according to this embodiment, as compared with the module of the seventh and eighth embodiments, includes a plurality of silicon-on-silicon modules for high-density assembly.

The silicon-on-silicon module refers to an assembly system in which a silicon LSI chip is connected on a silicon wiring substrate.

In FIG. 16, the silicon-on-silicon module is such that a plurality of silicon semiconductor devices 1200 and a silicon wiring substrate 1205 are assembled in a package including a ceramic wiring substrate 1207 and a water-cooling jacket 1210.

The semiconductor devices 1200 are mounted in the form of bare chip on the wiring substrate 1205. As compared with the fifth embodiment, therefore, a higher-density assembly and a larger chip are made possible. According to the embodiment under consideration, each semiconductor device 1200 corresponds to the destination 1009 of the clock signal in the fourth embodiment.

The semiconductor device 1200 has an optical receiver/phase adjuster 1201 formed together with an LSI circuit on the same silicon substrate.

The semiconductor devices 1200 are connected to the wiring substrate 1205 by solder bumps 1202.

Figure 17:
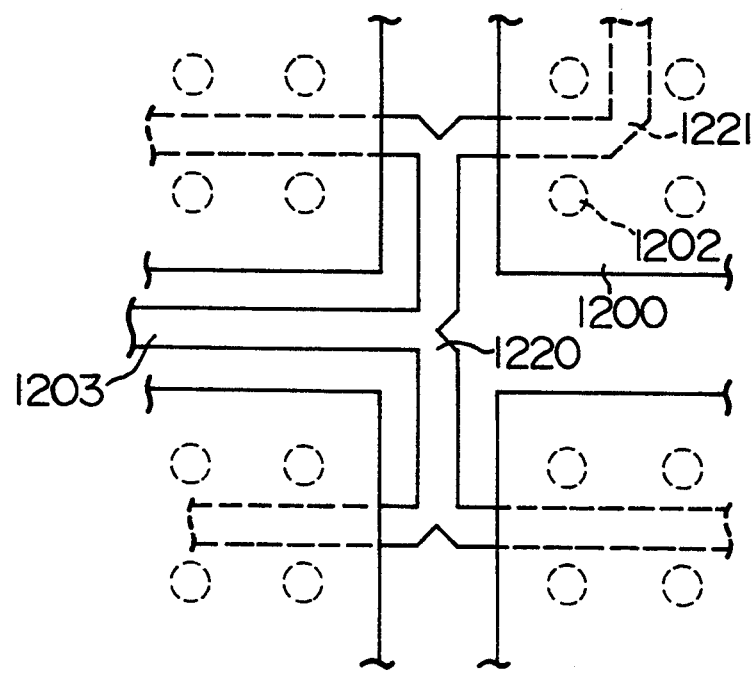
FIG. 17 is a top plan view for explaining the configuration of an optical waveguide interconnection according to an eighth embodiment of the invention.

The wiring substrate 1205 has formed thereon a polyimide (a high-molecular structure with diamine and carboxylic acid polymerized in straight chain by imino group, for example) optical waveguide 1203 providing an optical transmission path 1005 and a Cu/polyimide multiple wiring layer 1204 providing the electrical interconnection 1008. The optical waveguide 1203, as shown in FIG. 17, for example, is formed in a space between the solder bumps 1202, and therefore the electrical connection between the semiconductor devices 1200 and the wiring layer 1204 is not affected.

The wiring layer 1204 is connected to a mullite ceramic wiring substrate 1207 by a TAB (Tape Automated Bonding) 1206, and the wiring substrate 1207 is in turn connected to input-output pins 1208.

The semiconductor devices 1200, as in the seventh and eighth embodiments of FIGS. 14 and 15, can be cooled by injecting water into the water channel 1211 of the water-cooling jacket 1210.

The semiconductor devices 1200 are sealed by the water-cooling jacket 1210, the frame 1214 and the wiring substrate 1207.

The optical clock signal is supplied through the optical transmission path 1005 to the optical receiver/phase adjuster 1201 which is formed on the silicon semiconductor device 1200. In view of this, the wavelength of the optical clock signal is set to less than 1 $\mu$m considering the band gap of silicon.

The optical transmission path 1005 includes an optical fiber portion 1212 covered with a connector ferrule 1213 and an optical waveguide 1203.

The ceramic ferrule 1213 is fixedly sealed by a frame 1214 after adjusting the mounting position thereof for the waveguide 1203.

Figure 18:
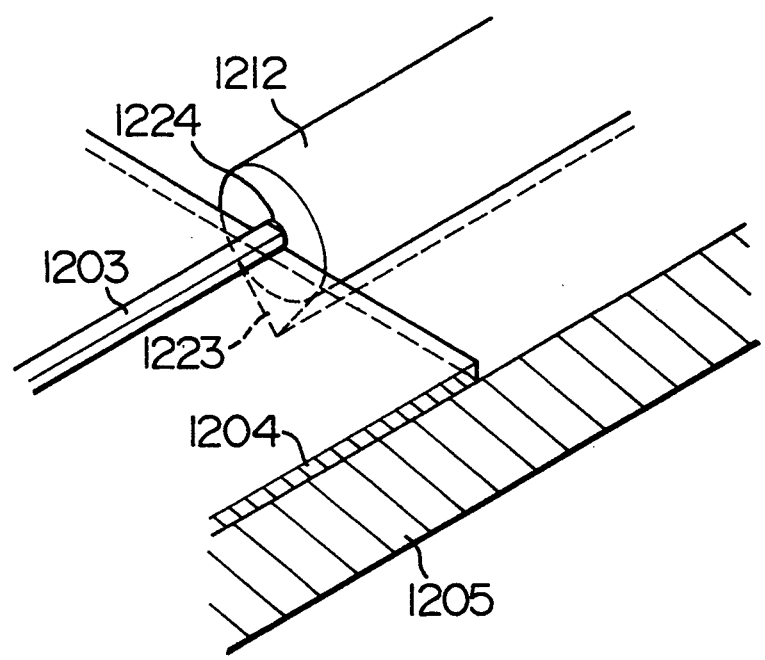
FIG. 18 is a perspective view showing the configuration of another optical interconnection according to the invention.

In place of the ferrule 1213, as shown in FIG. 18, for example, a V groove 1223 formed by anisotropic etching in the silicon substrate 1205 may be used to couple the core 1224 of the optical fiber 1212 with the optical waveguide 1203 for optical transmission.

The optical waveguide 1203 includes, as shown in FIG. 17, for example, an optical splitter 1220 and an optical path changer 1221 for leading the optical clock signal to the optical receiver/phase adjuster 1201 arranged at a predetermined position.

Figure 19:
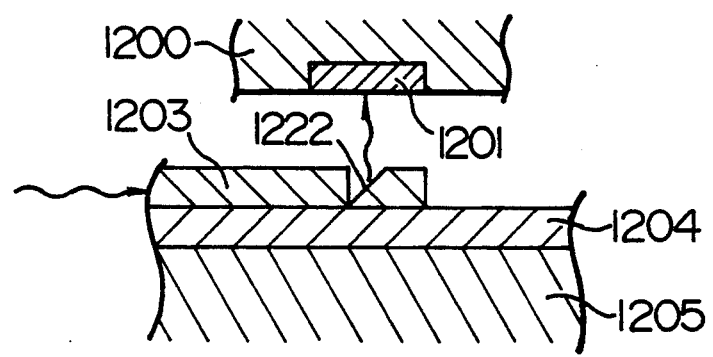
FIG. 19 is a diagram for explaining another optical interconnection according to the invention.

Also, the optical waveguide 1203 and the optical receiver/phase adjuster 1201 may have the function of optical coupling by a mirror 1222 as shown in FIG. 19, for example.

The optical alignment of the optical devices described above is accomplished by the self-alignment function of the solder bumps 1202, for example.

Now, the reference signal is supplied through the electrical connection 1008 to the phase adjuster 1201.

The electrical connection 1008 includes input-output pins 1208, a wiring substrate 1207, a TAB 1206, a wiring layer 1204 and a solder bump 1202.

The phase-adjusted clock signal is supplied to the destinations 1015 in the semiconductor device 1200 through the wiring layer in the surface of the semiconductor device 1200.

According to a ninth embodiment, even in a semiconductor module assembled in higher density than the seventh or eighth embodiment, the form of assembly is not limited, so that the clock signal is supplied to the optical receiver/phase adjuster 1201 of each semiconductor device 1200 through the optical transmission path 1005 (the optical fiber portion 1212, the optical waveguide 1203, etc.), and the reference signal supplied through the electrical connection 1008 (the wiring substrate 1207, the wiring layer 1204, etc.).

The phase-adjusted clock signal is supplied to the destinations 1015 in the semiconductor device 1200 from the optical receiver/phase adjuster 1201.

As described above, a very fast clock signal having a predetermined phase is distributed in the large-scale semiconductor device 1200.

Figure 20:
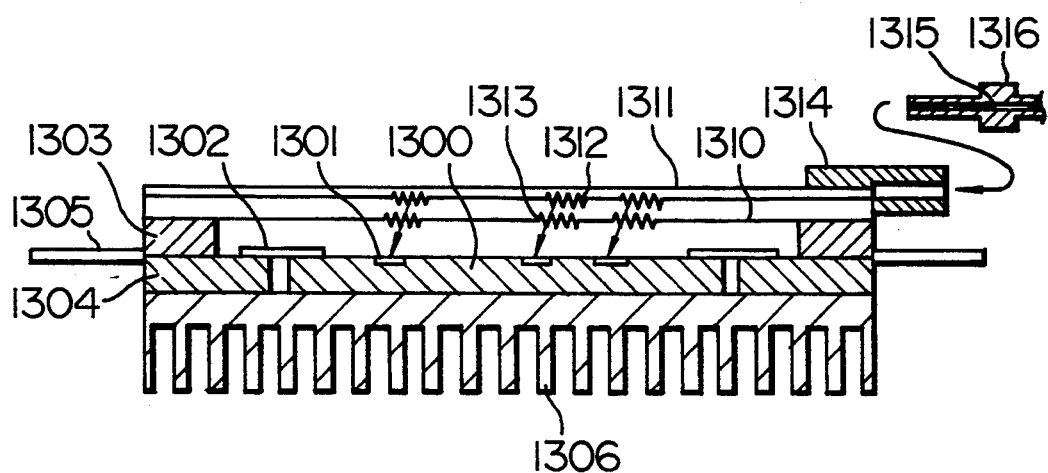
FIG. 20 is a sectional view showing the configuration of a processor to which a clock signal supply system is applied according to a tenth embodiment of the invention.

FIG. 20 is a sectional view showing the structure of a processor to which the clock signal supply system according to a tenth embodiment of the invention is applied.

The processor according to the tenth embodiment includes a large-area wafer-scale integration (referred to as "WSI") device 1300.

The WSI device 1300 is sealed in a module including a base 1306, frames 1303, 1304 and a cap 1310.

Destinations 1009 of the clock signal indicated in the fourth embodiment are located at a plurality of predetermined positions on the WSI device 1300. The WSI device 1300 is connected to the input-output pins 1305 by the TAB 1302.

The Cu-W ceramic base 1306 has formed thereon air-cooling fins for cooling the WSI device 1300.

WSI is an acronym of the Wafer Scale Integration. Different from an ordinary LSI chip fabricated from a semiconductor wafer cut out, the WSI has a circuit formed over the entire wafer.

The optical clock signal having a wavelength of 0.8 $\mu$m is supplied through the optical transmission path 1005 to the optical receiver/phase adjuster 1301.

The optical transmission path 1005 includes an optical fiber portion 1315 and an optical waveguide 1311.

An optical connector 1316 is connected to a receptacle 1314 whereby the optical fiber 1315 is coupled to the optical waveguide 1311 for optical transmission.

The optical waveguide 1311 is formed on the glass cap 1310.

The optical clock signal transmitted through the optical waveguide 1311 is distributed to the optical receiver/phase adjuster 1301 by grating couplers 1312, 1313.

The reference signal is supplied through the electrical connection 1008 to the optical receiver/phase adjuster 1301. The electrical connection 1008 includes the input-output pins 1305, the TAB 1302 and the wiring layer on the WSI device 1300.

The clock signal of which the phase has been adjusted by the optical receiver/phase adjuster 1301 is supplied to the destinations 1015 in the WSI device 1300.

As a result, according to the present embodiment, a very fast clock signal having a predetermined phase can be supplied to a plurality of regions in a large-area WSI device.

Figure 21:
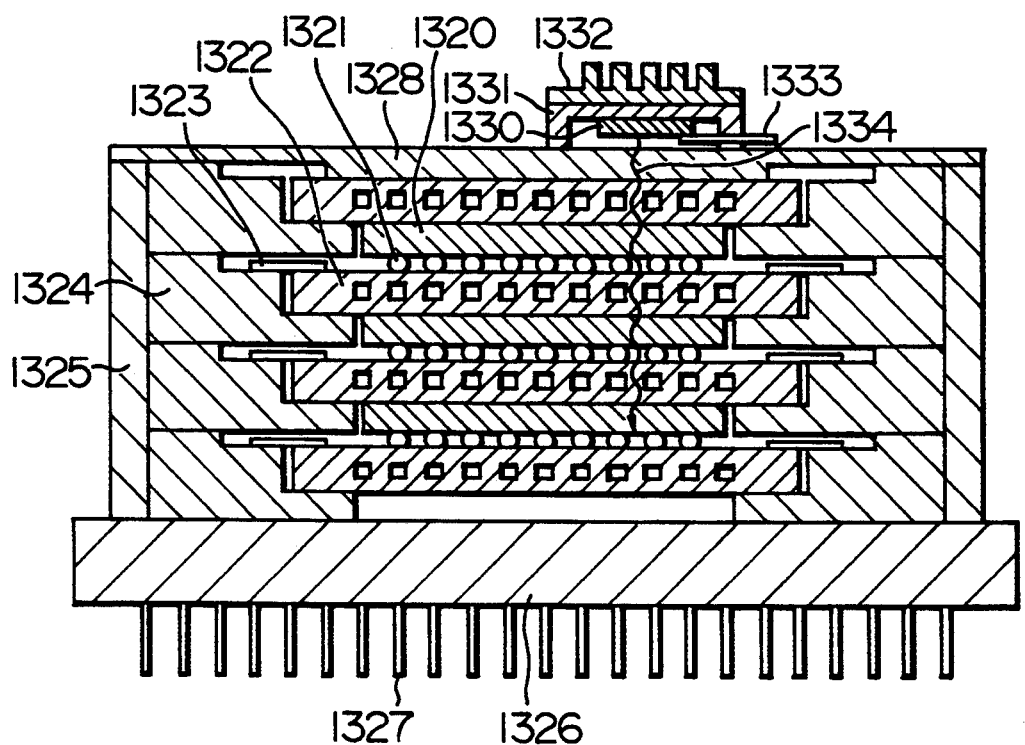
FIG. 21 is a sectional view showing the configuration of a processor to which a clock signal supply system is applied according to an eleventh embodiment of the invention.

FIG. 21 is a sectional view showing the structure of a processor to which the clock signal supply system according to an eleventh embodiment of the invention is applied.

The processor according to the eleventh embodiment includes a plurality of WSI devices.

The WSI devices 1320 are structured in stack constituting a WSI module larger in scale than the tenth embodiment.

Each WSI device 1320 corresponds to the destination 1009 of the clock signal in the first embodiment.

The optical receiver 1004 and the phase adjuster 1010 are formed at predetermined positions on the silicon WSI device 1320.

The optical receiver 1004 is fabricated by heteroepitaxial growth of an InP semiconductor on silicon.

Further, the WSI device 1320 is connected to a silicon wiring substrate 1322 by solder bumps 1321. The silicon wiring substrate 1322 has formed by anisotropic etching thereon a water channel for cooling the WSI device 1320 in addition to a multiple wiring layer.

The wiring substrate 1322 is connected to a multilayer ceramic wiring substrate 1324 by a TAB 1323, and the wiring substrate 1324 is connected to a wiring substrate 1324 of another WSI device 1320 or a multilayer ceramic wiring substrate 1326. A frame 1325 and a cap 1328 are fixedly sealed on the wiring substrate 1326.

The clock signal generated by the clock oscillator 1001 is supplied through the input-output pins 1333 to the optical transmitter 1003 including an InP OEIC 1330.

The optical clock signal outputted from the OEIC 1330 is supplied through the optical transmission path 1005 to a predetermined WSI device 1320.

The optical transmission path 1005 includes a glass cap 1328, a wiring substrate 1322 and a plurality of WSI devices 1320.

The OEIC 1330 is formed with a surface-emitting laser diode and a driver circuit therefor on the same substrate, and is sealed by a package 1331 and the cap 1328. The OEIC 1330 thus is configured to be cooled by a fin radiator 1332.

In view of the fact that the optical clock signal is required to pass the silicon WSI devices 1320 and the silicon wiring substrate 1322, the wavelength of the optical clock signal is set to larger than 1.0 $\mu$m considering the band gap of silicon.

The reference signal is applied through the electrical connection 1008 to the WSI devices 1320.

The electrical connection 1008 includes input-output pins 1327, wiring substrates 1326, 1324, a TAB 1323, a wiring substrate 1322 and solder bumps 1321.

The clock signal of which the phase has been adjusted on the basis of the reference signal is applied to the destinations 1015 in the WSI devices 1320.

As a consequence, according to the eleventh embodiment, a large-scale highly-integrated processor with WSI devices assembled in stack is supplied with very fast clock signals in phase to predetermined regions in a predetermined WSI device 1320.

Figure 22:
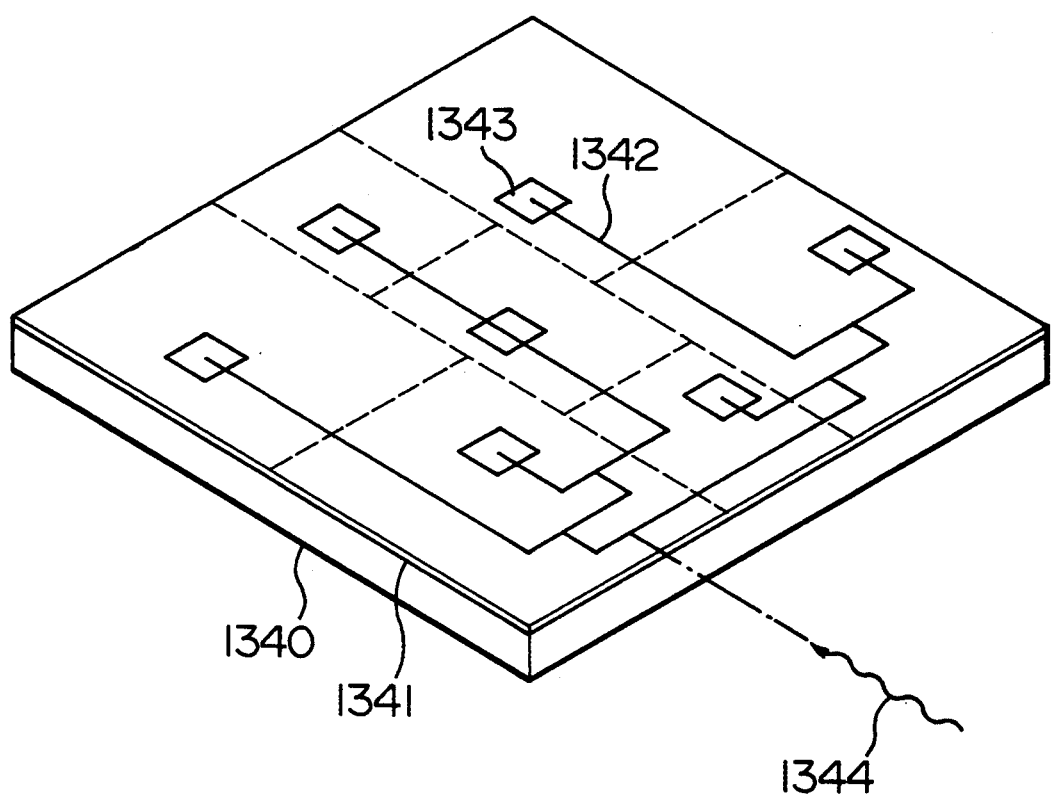
FIG. 22 is a diagram showing a perspective view of the configuration of a processor to which a clock signal supply system is applied according to a twelfth embodiment of the invention.

FIG. 22 is a perspective view showing the structure of a processor to which the clock signal supply system according to a twelfth embodiment of the invention is applied.

The processor according to this embodiment includes a WSI device 1340.

As indicated by dotted lines in FIG. 22, the circuit formed on the WSI device 1340 is divided into a plurality of macro cells. These macro cells correspond to the destinations 1009 of the clock signal in the fourth embodiment.

An optical receiver/phase adjuster 1343 is formed on each macro cell.

The WSI device 1340 has the surface thereof formed with a multiple wiring layer 1341 on which an optical waveguide 1342 is laid.

The optical clock signal 1344 is split by the optical waveguide 1342 and led to each optical receiver phase adjuster 1343.

The optical receiver/phase adjuster 1343 has a portion of the surface wiring layer 1341 formed with a through hole. A black mask film is formed as an optical shield on the portions other than the through hole in order to prevent the irradiated light leaking out of the optical waveguide 1342 from entering the circuit.

The reference signal is supplied to the optical receiver/phase adjuster 1343 by the wiring layer 1341. The clock signal with the phase thereof adjusted by the optical receiver/phase adjuster 1343 is distributed to the destinations 1015 in the macro cells through the wiring layer 1341.

As a result, aeeording to the twelfth embodiment, a very fast clock signal having a predetermined phase can be distributed into the macro cells of the WSI devices 1341.

It will thus be understood from the foregoing description that according to the present invention the frequency information of a clock signal is supplied by light and the phase information of a clock signal by electricity. Also, according to the invention, very fast clock signals in phase are supplied to destinations.

Since certain changes may be made in the above system without departing from the scope of the invention herein involved, it is intended that all matter contained in the above description or shown in the accompanying drawings shall be interpreted as illustrative and not in a limiting sense.

We claim:

1. A semiconductor device with a semiconductor chip connected to a wiring substrate in flip-chip fashion, comprising:
   a plurality of electrode members arranged two-dimensionally for connecting said semiconductor chip and said wiring substrate; and
   an optical waveguide formed in a space between said electrode members.

2. A semiconductor device according to claim 1, wherein said semiconductor chip and said wiring substrate are connected in flip-chip fashion by said electrode members disposed in at least a through-hole perpendicular to the principal surface of said optical waveguide.

3. A semiconductor device according to claim 2, wherein said semiconductor chip has a signal wiring connected to said optical waveguide and said wiring substrate, and a power wiring connected to said wiring substrate.

4. A semiconductor device according to claim 1, wherein a clock signal is distributed by an optical waveguide to a semiconductor chip having a photodetector and a clock receiving circuit.

5. A semiconductor device according to claim 1, wherein a semiconductor chip having a photodetector and a receiving circuit is connected by an optical waveguide as a bus.

6. A semiconductor device according to claim 1, wherein each of said electrode members is made of a metal bump.

7. A semiconductor device according to claim 1, wherein said wiring substrate comprises optical interconnecting means for receiving an optical clock signal and leading said optical clock signal to said optical waveguide, and a wiring for receiving an electrical reference signal frequency-divided from said clock signal and applying said electrical reference signal to one of said electrode members, said semiconductor chip includes electrical interconnecting means for transmitting the frequency-divided electrical signal to a predetermined destination, and phase adjusting means for adjusting a selected one of the lead and lag of the clock signal outputted from said optical interconnecting means on the basis of the reference signal transmitted by said electrical interconnecting means, thus putting the clock signal in phase, and outputting a phase-adjusted clock signal having a predetermined frequency to following destinations.

8. A semiconductor device according to claim 7, wherein said optical interconnecting means includes optical transmitting means for converting an electrical clock signal produced from a clock oscillator into said optical clock signal, optical receiving means for converting the optical clock signal into an electrical clock signal, and said optical waveguide for supplying said optical clock signal from said optical transmitting means to said optical receiving means.

9. A semiconductor device according to claim 7, wherein said reference signal generating means frequency-divides a clock signal having said first frequency and generates a reference signal of not more than the frequency bandwidth of said electrical interconnecting means.

10. A semiconductor device according to claim 8, wherein said optical transmitting means includes a laser diode for oscillating said optical clock signal and laser diode-driving means having the function of converting said electrical clock signal into a drive current for said laser diode.

11. A semiconductor device according to claim 8, wherein said optical transmitting means includes optical amplifier means for amplifying said optical clock signal.

12. A semiconductor device according to claim 11, wherein said optical amplifier means is a selected one of a rare atom-doped optical fiber amplifier based on optical pumping and a semiconductor optical amplifier based on current injection pumping.

13. A semiconductor device according to claim 8, wherein said optical transmitting means includes optical output control means having the function of holding the signal amplitude of said optical clock signal at a predetermined value.

14. A semiconductor device according to claim 13, wherein said optical output control means is an auto power control circuit.

15. A semiconductor device according to claim 8, wherein said optical receiving means includes a photodetector for detecting said optical clock signal and photodetector driving means having the function of converting the photocurrent signal flowing in the photodetector into said electrical clock signal.

16. A semiconductor device according to claim 15, wherein said photodetector is a photodiode.

17. A semiconductor device according to claim 8, wherein said optical receiving means includes bandpass means for the frequency of said electrical clock signal.

18. A semiconductor device according to claim 17, wherein said bandpass means is a bandpass filter circuit.

19. A semiconductor device according to claim 8, wherein said optical transmitting means includes a selected one of an optical fiber and an optical waveguide.

20. A semiconductor device according to claim 8, wherein said optical transmitting means includes at least a selected one of a lens, a mirror, a grating and a prism.

21. A semiconductor device according to claim 8, wherein said optical transmitting means includes optical branching means for splitting the optical clock signal.

22. A semiconductor device according to claim 21, wherein said optical branching means includes at least a selected one of an optical fiber star coupler, an optical waveguide star coupler and a prism beam splitter.

23. A semiconductor device according to claim 8, wherein said optical transmitting means includes at least a selected one of an optical path converter, an optical collimator, an optical focusing means and optical shield means.

24. A semiconductor device according to claim 23, wherein said optical path converter includes at least a selected one of a mirror, a prism and a grating, said optical collimator and said optical focusing means include at least a selected one of a lens and a grating, and said optical shield means includes at least a selected one of a partition, a cover and a mask.

25. A semiconductor device according to claim 8, wherein the optical clock signal radiated on said optical receiving means by said optical transmitting means and said optical waveguide has at least the minimum receivable power at the frequency of said optical clock signal.

* * * * *